(12) United States Patent
Wang et al.

(10) Patent No.: US 11,411,112 B2
(45) Date of Patent: Aug. 9, 2022

(54) GATE STRUCTURE, METHOD OF FORMING THE SAME, AND SEMICONDUCTOR DEVICE HAVING THE SAME

(71) Applicant: Taiwan Semiconductor Manufacturing Co., Ltd., Hsinchu (TW)

(72) Inventors: Chun-Chieh Wang, Kaohsiung (TW); Sheng-Wei Yeh, Taichung (TW); Yueh-Ching Pai, New Taipei (TW); Chi-Jen Yang, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/888,846

(22) Filed: May 31, 2020

(65) Prior Publication Data
US 2021/0036147 A1 Feb. 4, 2021

Related U.S. Application Data

(60) Provisional application No. 62/880,657, filed on Jul. 31, 2019.

(51) Int. Cl.
*H01L 29/78* (2006.01)
*H01L 21/768* (2006.01)
*H01L 29/66* (2006.01)
*H01L 29/16* (2006.01)
*H01L 29/49* (2006.01)
*H01L 27/088* (2006.01)
*H01L 23/532* (2006.01)

(52) U.S. Cl.
CPC ...... *H01L 29/785* (2013.01); *H01L 21/76829* (2013.01); *H01L 21/76841* (2013.01); *H01L 21/76846* (2013.01); *H01L 21/76849* (2013.01); *H01L 29/1604* (2013.01); *H01L 29/49* (2013.01); *H01L 29/66795* (2013.01); *H01L 23/53266* (2013.01); *H01L 27/0886* (2013.01); *H01L 29/66545* (2013.01)

(58) Field of Classification Search
CPC ............ H01L 29/785; H01L 29/66795; H01L 29/66545; H01L 21/76829; H01L 21/76841; H01L 21/76846; H01L 21/7684; H01L 23/53266
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |

(Continued)

*Primary Examiner* — Tuan A Hoang
(74) *Attorney, Agent, or Firm* — JCIPRNET

(57) ABSTRACT

Provided are a gate structure and a method of forming the same. The gate structure includes a gate dielectric layer, a metal layer, and a cluster layer. The metal layer is disposed over the gate dielectric layer. The cluster layer is sandwiched between the metal layer and the gate dielectric layer, wherein the cluster layer at least includes an amorphous silicon layer, an amorphous carbon layer, or an amorphous germanium layer. In addition, a semiconductor device including the gate structure is provided.

20 Claims, 22 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 11,062,900 B2 * | 7/2021 | Li .................. H01L 21/3105 |
| 2011/0156174 A1 * | 6/2011 | Dewey ............... H01L 29/517 |
| | | 257/411 |
| 2015/0061042 A1 * | 3/2015 | Cheng ............ H01L 21/823842 |
| | | 257/412 |
| 2015/0262828 A1 * | 9/2015 | Brand ............... H01L 29/7833 |
| | | 438/592 |
| 2016/0013289 A1 * | 1/2016 | Xu ................. H01L 21/76841 |
| | | 257/288 |
| 2016/0118261 A1 * | 4/2016 | Haukka ................ C23C 16/34 |
| | | 438/592 |
| 2021/0296114 A1 * | 9/2021 | Koo ................ C23C 16/45536 |

* cited by examiner

GATE STRUCTURE, METHOD OF FORMING THE SAME, AND SEMICONDUCTOR DEVICE HAVING THE SAME

CROSS-REFERENCE TO RELATED APPLICATION

This application claims the priority benefit of U.S. provisional application Ser. No. 62/880,657, filed on Jul. 31, 2019. The entirety of the above-mentioned patent application is hereby incorporated by reference herein and made a part of this specification.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
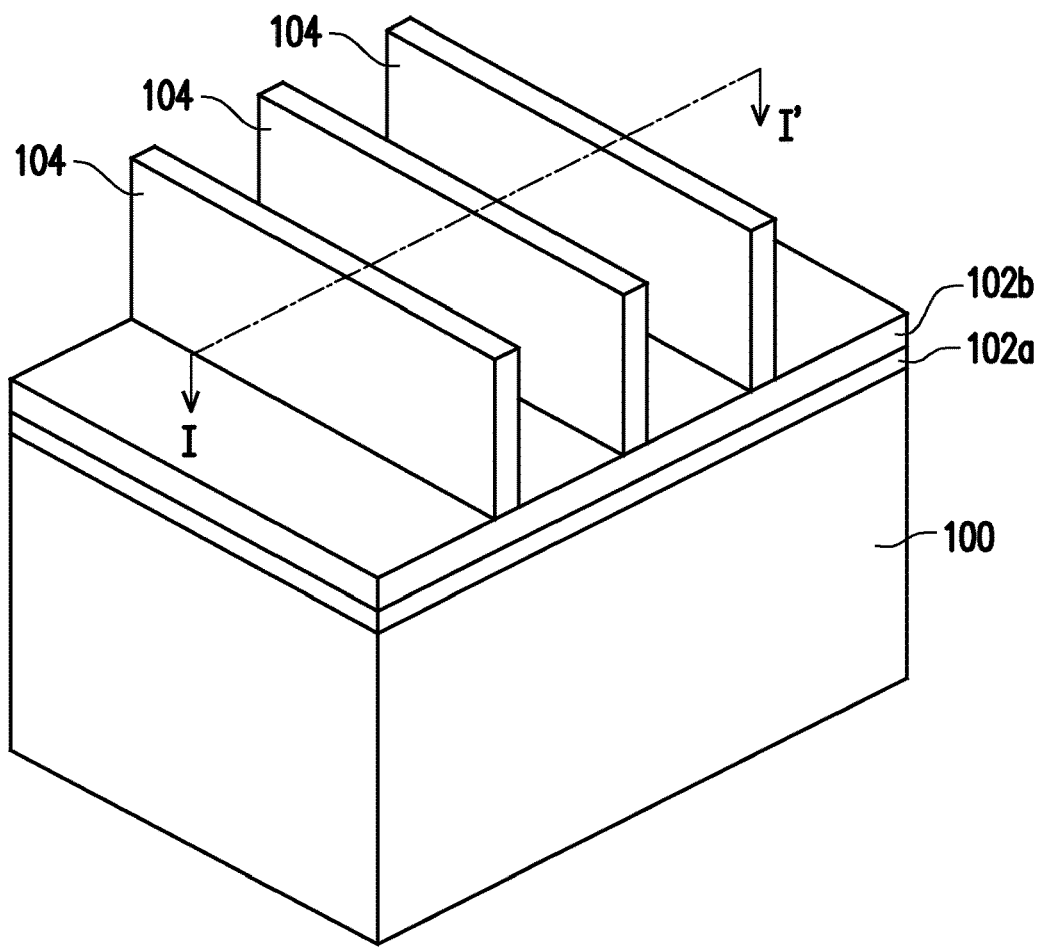
FIG. 1A to FIG. 1K are perspective views illustrating a method for manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with some embodiments, a cluster layer is formed between a gate dielectric layer and a metal layer. The cluster layer may include a work function metal layer, a barrier layer, a cap layer, and a glue layer stacked in order. The cap layer may include an amorphous silicon, carbon, or germanium layer and may be sandwiched between the barrier layer and the glue layer. In the case, the cap layer is able to prevent Al and/or Ti atoms of the work function metal layer from diffusing into the gate dielectric layer (e.g., an interface (IL) layer) and into the seam (i.e., the metal (W) layer), thereby avoiding threshold voltage (Vt) shift of the transistor, improving the control ability of the gate structure, avoiding leakage, and avoiding the gate dielectric layer burning out.

FIG. 1A to FIG. 1K are perspective views illustrating a method for manufacturing a semiconductor device in accordance with some embodiments of the disclosure. FIG. 2A to FIG. 2K are cross-sectional views illustrating the method for manufacturing the semiconductor device in FIG. 1A to FIG. 1K. The semiconductor device illustrated in the following embodiments may be applied to, but not limited thereto, a fin field-effect transistor (FinFET). In other embodiments, the semiconductor device is also applied to a planar transistor, gate-all-around (GAA) FET, or other transistors including a metal gate.

Figure 2A:
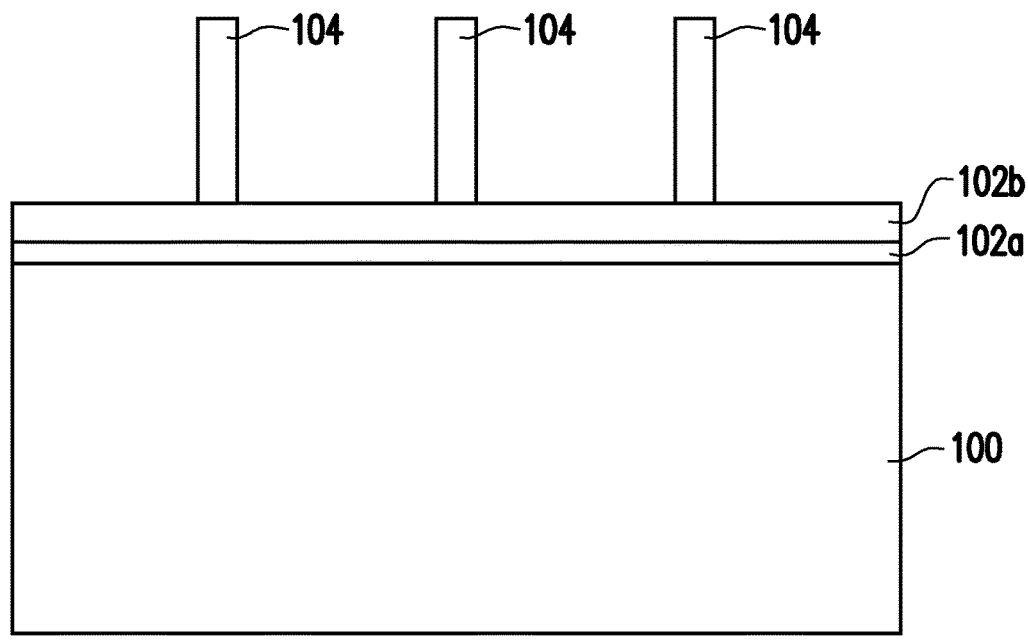
FIG. 2A to FIG. 2K are cross-sectional views illustrating the method for manufacturing the semiconductor device in FIG. 1A to FIG. 1K.

Referring to FIG. 1A and FIG. 2A, a substrate 100 is provided. In some embodiments, the substrate 100 includes a crystalline silicon substrate (e.g., wafer). The substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, a pad layer 102a and a mask layer 102b are sequentially formed on the substrate 100. The pad layer 102a may be a silicon oxide thin film formed by, for example, a thermal oxidation process. The pad layer 102a may act as an adhesion layer between the substrate 100 and the mask layer 102b. The pad layer 102a may also act as an etch stop layer for etching the mask layer 102b. In some embodiments, the mask layer 102b may be a silicon nitride layer formed by low-pressure chemical vapor deposition (LPCVD) or plasma enhanced chemical vapor deposition (PECVD). The mask layer 102b is used as a hard mask during subsequent photolithography processes. A patterned photoresist layer 104 having a predetermined pattern is formed on the mask layer 102b.

Figure 1B:
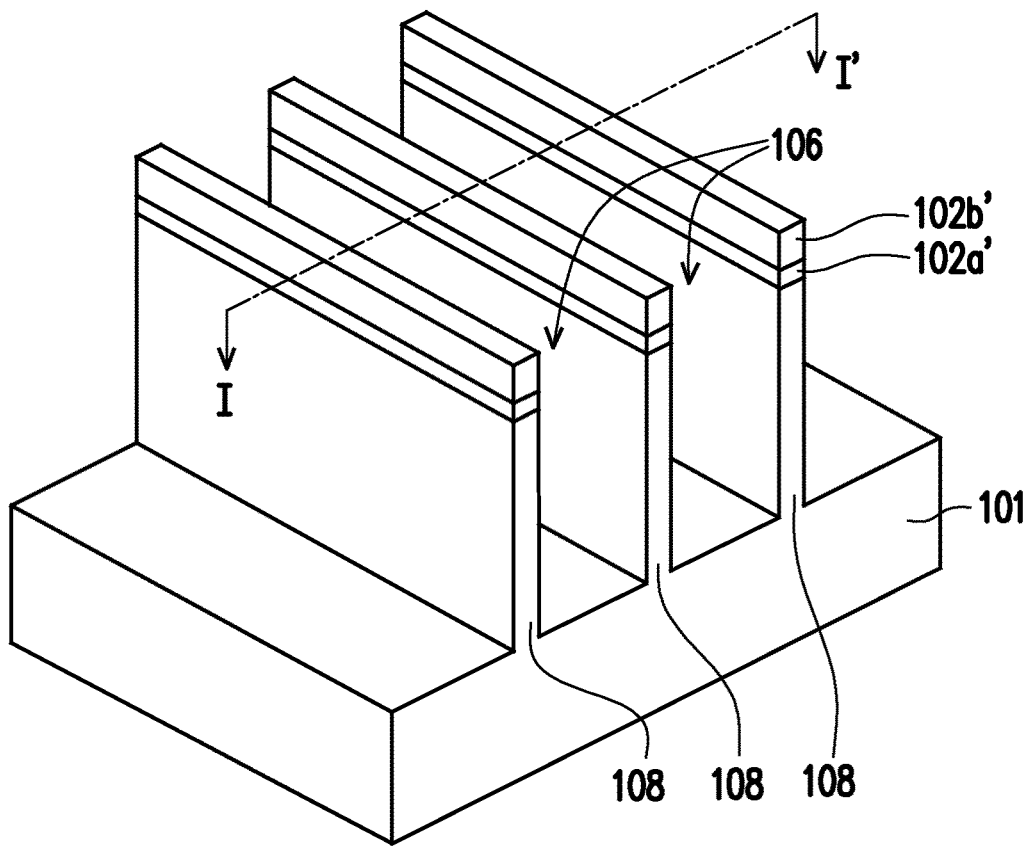
Figure 2B:
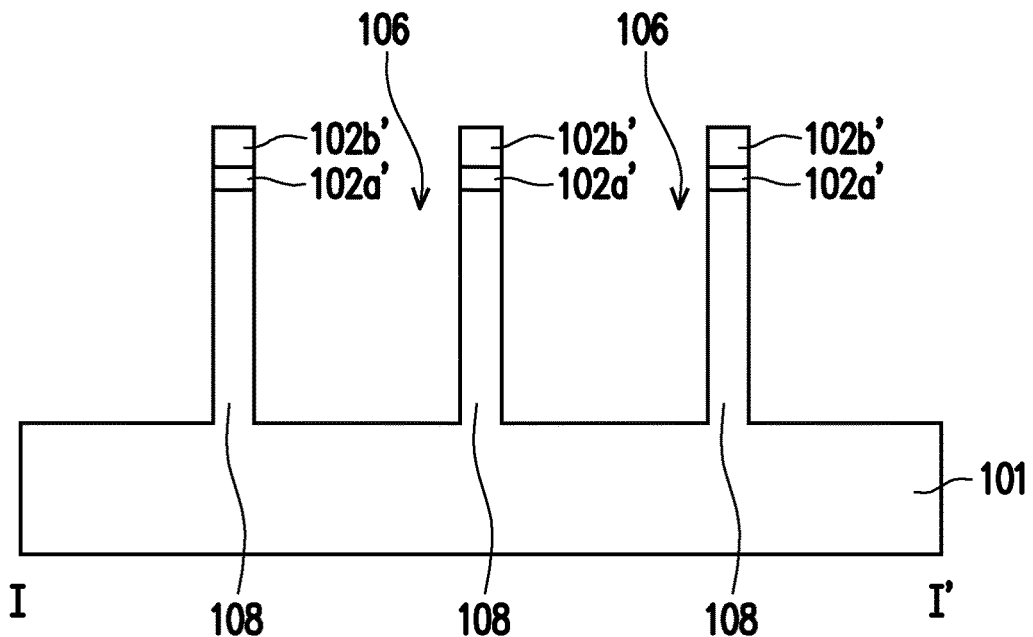

Referring to FIGS. 1A-1B and FIGS. 2A-2B, the mask layer 102b and the pad layer 102a which are not covered by the patterned photoresist layer 104 are sequentially etched to form a patterned mask layer 102b' and a patterned pad layer 102a'. The patterned mask layer 102b' and the patterned pad layer 102a' expose underlying substrate 100. By using the patterned photoresist layer 104, the patterned mask layer 102b', and the patterned pad layer 102a' as a mask, portions of the substrate 100 are exposed and etched to form a plurality of trenches 106 and a plurality of fins 108 between the trenches 106. After the trenches 106 and the fins 108 are formed, the patterned photoresist layer 104 is then removed. In the case, as shown in FIG. 1B, the fins 108 are patterned as semiconductor strips and separated by the trenches 106. The patterned mask layer 102b' and the patterned pad layer 102a' are still disposed on the fins 108. Although only three fins 108 are illustrated in FIG. 1B, the embodiments of the present disclosure are not limited thereto. In other embodiments, the number of the fins 108 may be adjusted by the need, such as one fin, two fins, four fins, or more fins.

Figure 1C:
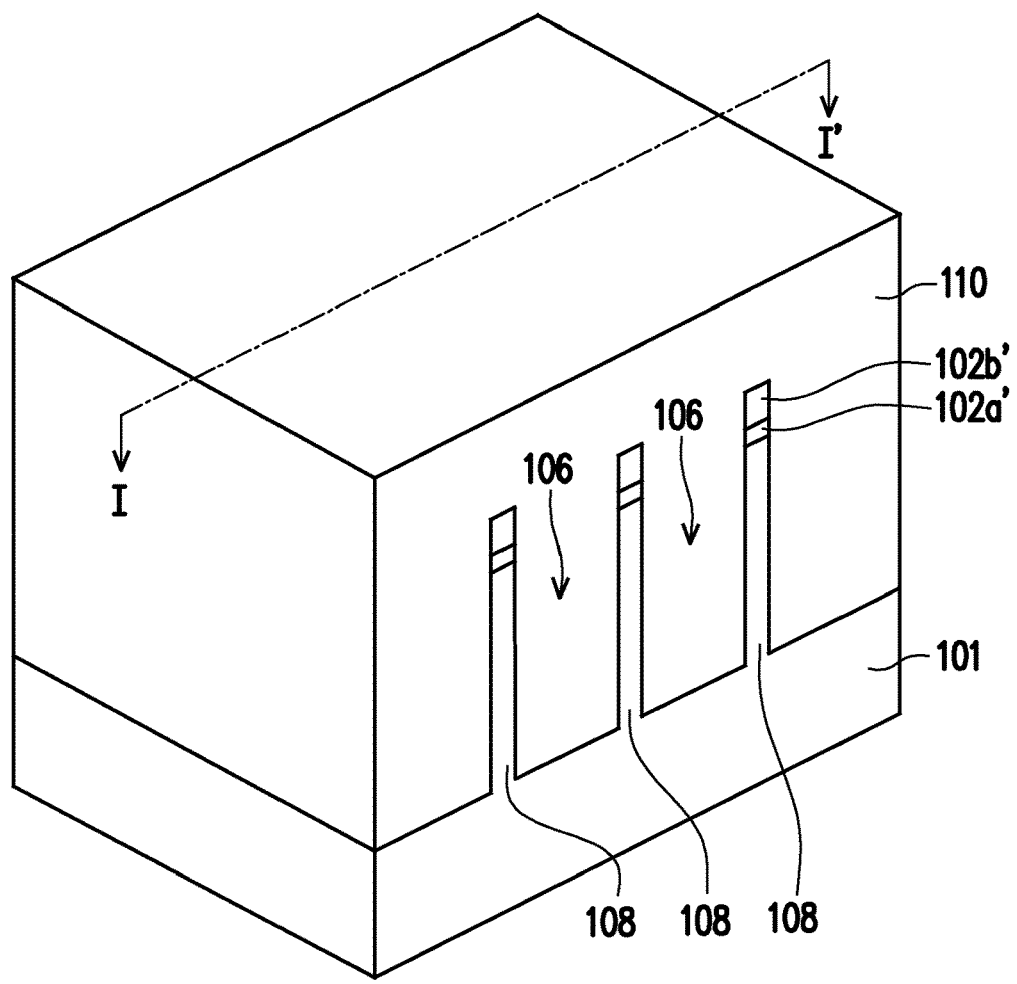
Figure 2C:
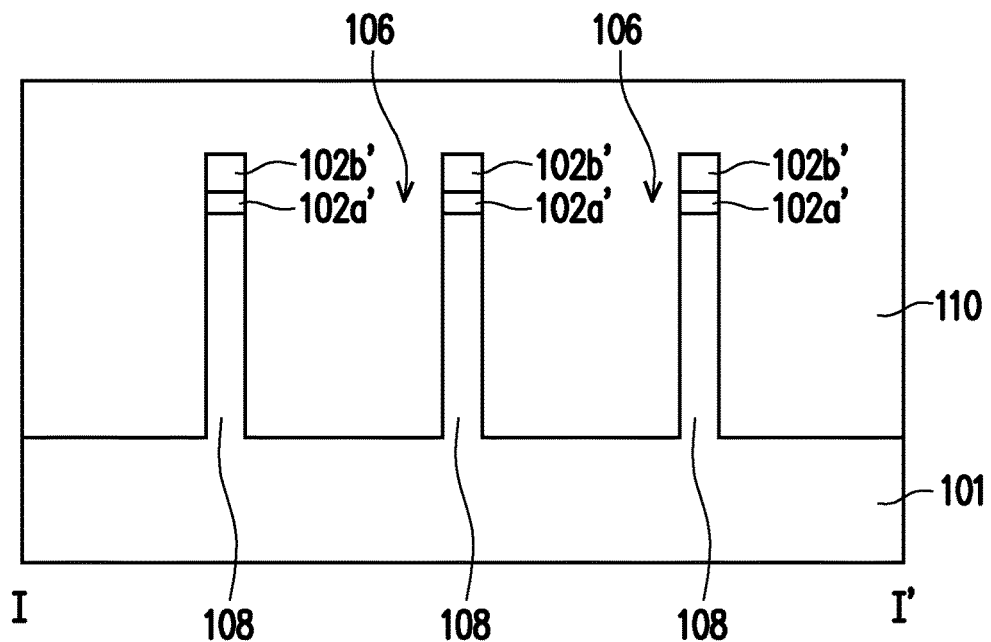

Referring to in FIG. 1C and FIG. 2C, an insulating material 110 is formed over the substrate 101 to cover the fins 108 and to fill up the trenches 106. In addition to the fins 108, the insulating material 110 further covers the patterned pad layer 102a' and the patterned mask layer 102b'. The insulating material 110 may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material 110 may be formed by high-density-plasma chemical vapor deposition (HDP-CVD), sub-atmospheric CVD (SACVD), or spin on.

Figure 1D:
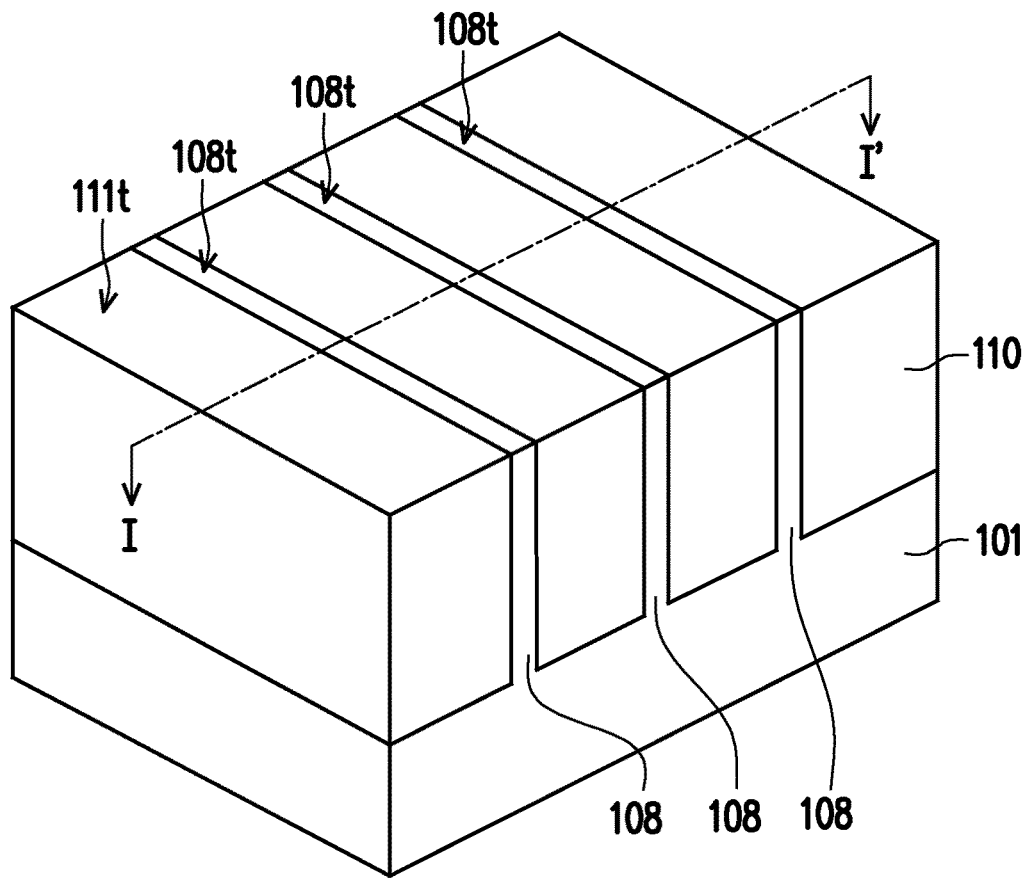
Figure 2D:
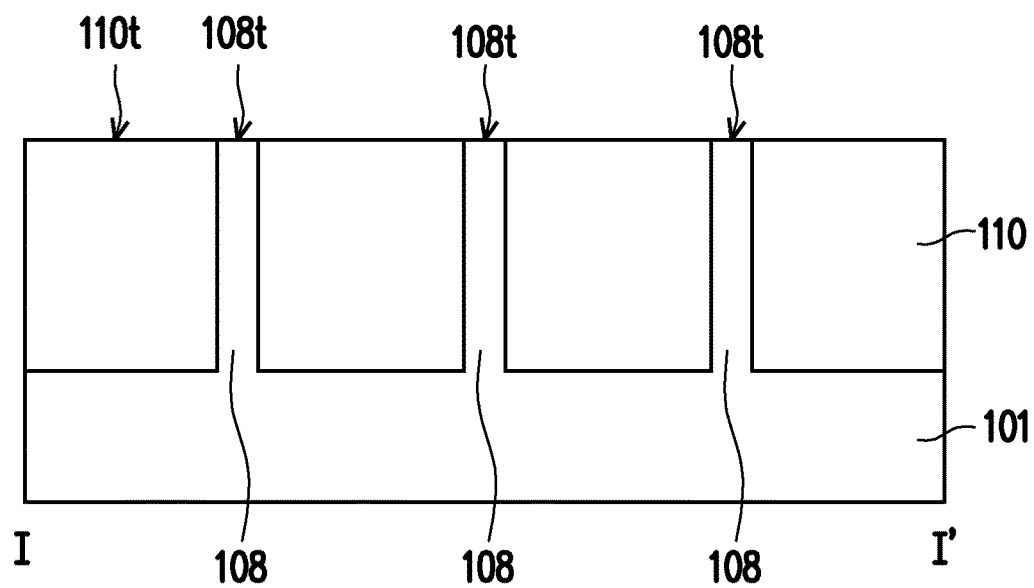
Figure 2E:
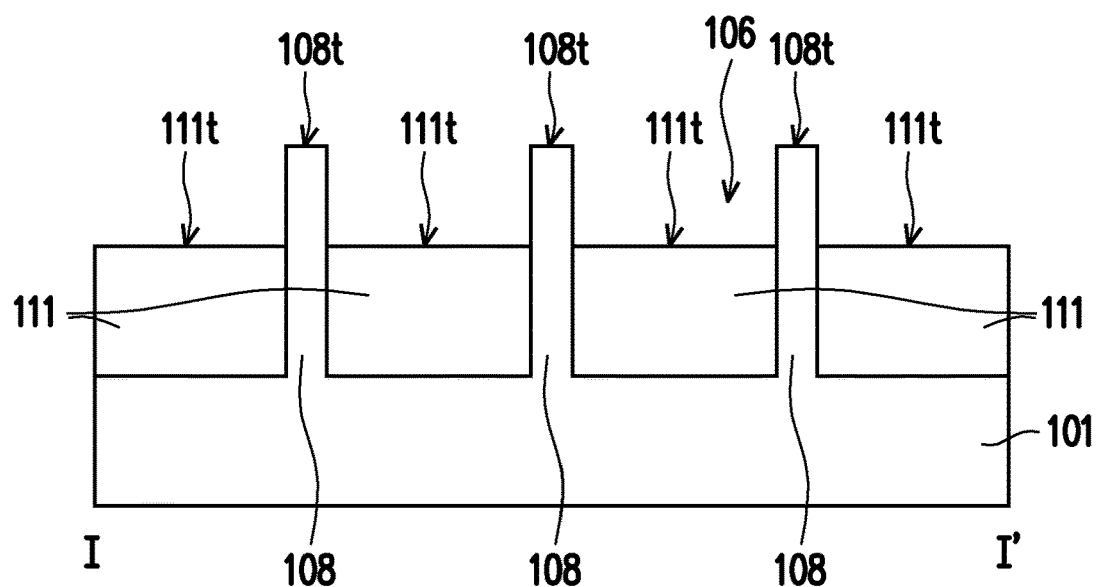

Referring to FIGS. 1C-1D and FIGS. 2C-2D, a planarization process may be performed, to remove a portion of the insulating material 110, the patterned mask layer 102b' and the patterned pad layer 102a' until the fins 108 are exposed. In the case, as shown in FIGS. 1D and 2D, top surfaces 108t of the fins 108 are substantially coplanar with a top surface 110t of the planarized insulating material 110. In some embodiments, the planarization process includes a chemical mechanical polish (CMP), an etching back process, a combination thereof, or the like.

Referring to FIGS. 1D-1E and FIGS. 2D-2E, the insulating material 110 is recessed to form a plurality of isolation regions 111. After recessing the insulating material 110, the fins 108 protrude from between neighboring isolation regions 111. That is, top surfaces 111t of the isolation regions 111 may be lower than the top surfaces 108t of the fins 108. Further, the top surfaces 111t of the isolation regions 111 may have a flat surface as illustrated, a convex surface, a concave surface (such as dishing), or a combination thereof. In some embodiments, the insulating material 110 is recessed by using an appropriate etching process, such as a wet etching process with hydrofluoric acid (HF), a dry etching process, or a combination thereof. In some embodiments, a height difference between the top surfaces 108t of the fins 108 and the top surfaces 111t of the isolation regions 111 ranges from about 1 nm to about 300 nm.

Figure 1E:
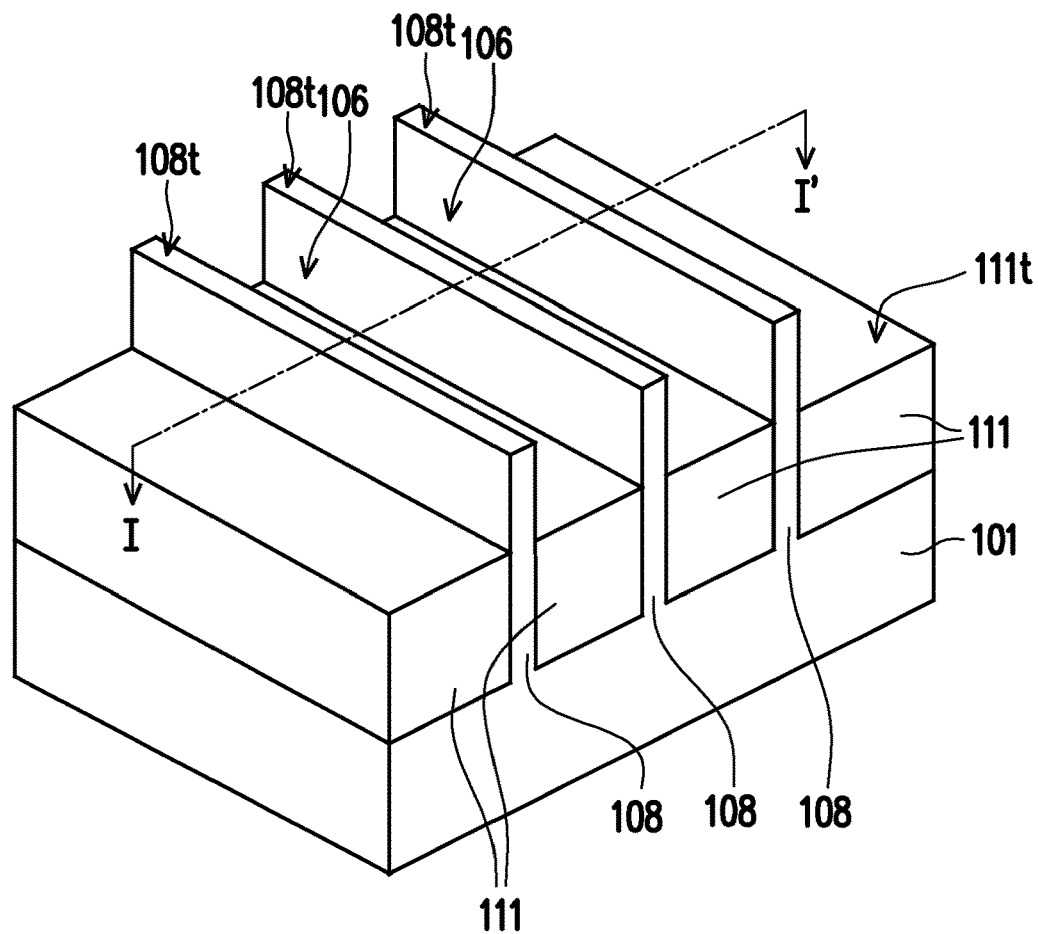
Figure 1F:
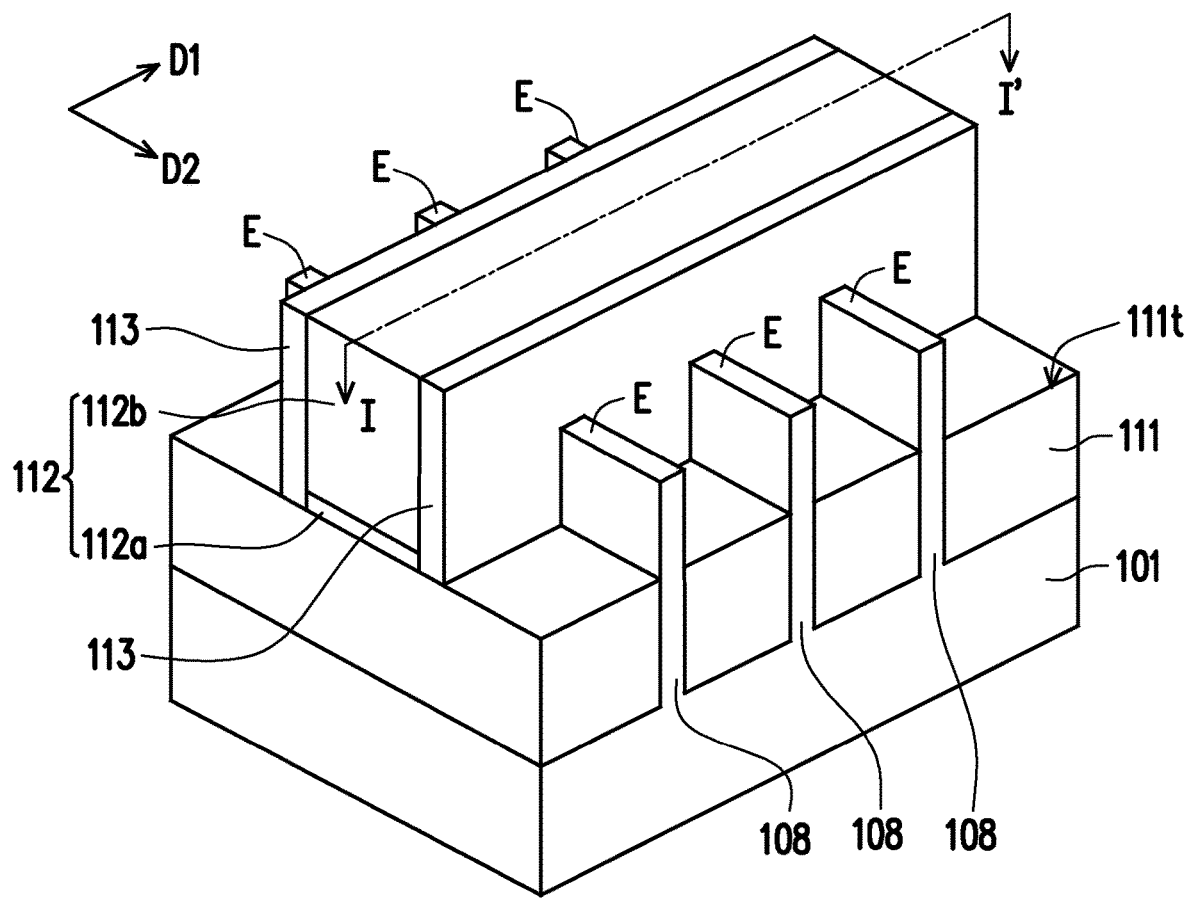
Figure 2F:
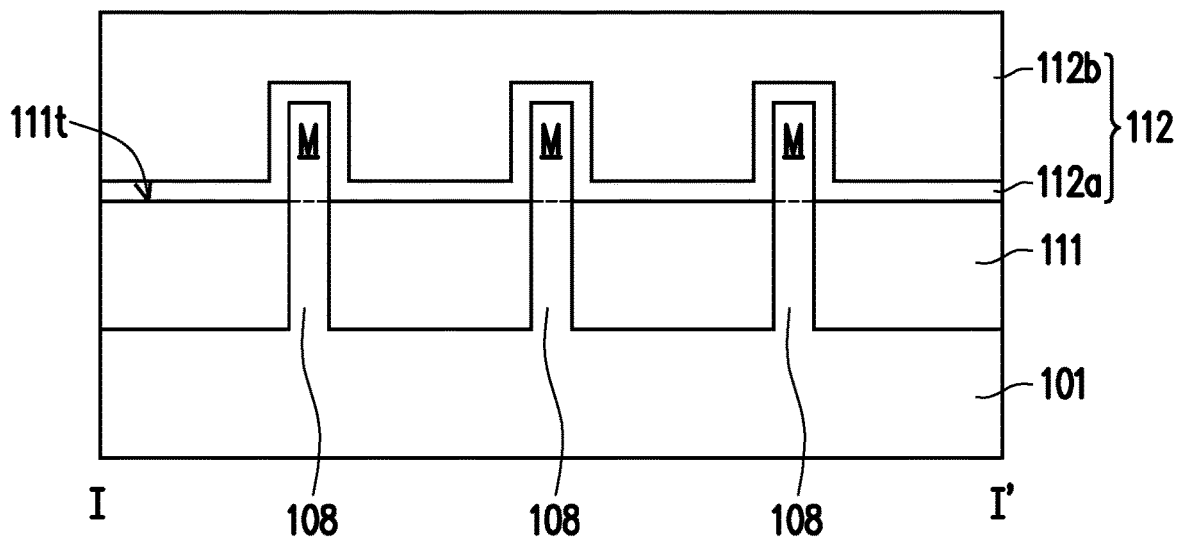
Figure 2G:
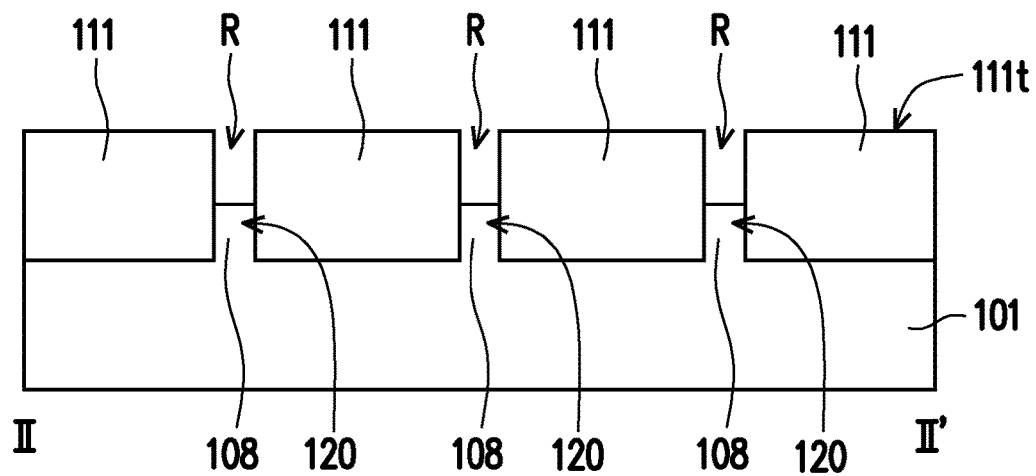

Referring to FIG. 1F and FIG. 2F, a dummy gate structure 112 is formed over portions of the fins 108 and portion of the isolation regions 111. The dummy gate structure 112 may extend along an extending direction D1 perpendicular to an extending direction D2 of the fins 108. That is, the dummy gate structure 112 may be formed across the fins 108. In some embodiments, the dummy gate structure 112 covers the middle portions M (as shown in FIG. 2F) of the fins 108 and reveals other portions of the fins 108. The other portions of the fins 108 at opposite sides of the middle portions M may be referred to as exposed portions E, as shown in FIG. 1F.

Specifically, the dummy gate structure 112 may include a dummy gate dielectric layer 112a and a dummy gate 112b disposed over the dummy gate dielectric layer 112a. In some embodiments, the dummy gate dielectric layer 112a is formed to separate the fins 108 and the dummy gate 112b and to function as an etch stop layer. The dummy gate dielectric layer 112a may include silicon oxide, silicon nitride, or silicon oxy-nitride. In some embodiments, the dummy gate dielectric layer 112a is formed by using a suitable process, such as atomic layer deposition (ALD), chemical vapor deposition (CVD), physical vapor deposition (PVD), thermal oxidation, UV-ozone oxidation, or combinations thereof. In some embodiments, the dummy gate 112b includes a silicon-containing material, such as poly-silicon, amorphous silicon, or a combination thereof. The dummy gate 112b may be formed by using a suitable process, such as ALD, CVD, PVD, plating, or combinations thereof. Although the dummy gate 112b illustrated in FIG. 1F is a single-layered structure, the embodiments of the present disclosure are not limited thereto. In other embodiments, the dummy gate 112b may be a multi-layered structure.

In addition to the dummy gate structure 112, a pair of spacers 113 are also formed over portions of the fins 108 and portion of the isolation regions 111. As illustrated in FIG. 1F, the spacers 113 are disposed on sidewalls of the dummy gate structure 112. In some embodiments, the spacers 113 and the dummy gate structure 112 have the same extending direction D1. Similar to the dummy gate structure 112, the spacers 113 are also formed across the fins 108. In some embodiments, the spacers 113 are formed of dielectric materials, such as silicon oxide, silicon nitride, carbonized silicon nitride (SiCN), SiCON, or a combination thereof. Although the spacers 113 illustrated in FIG. 1F is a single-layered structure, the embodiments of the present disclosure are not limited thereto. In other embodiments, the spacers 113 may be a multi-layered structure.

Referring to FIGS. 1F-1G and FIGS. 2F-2G, the exposed portions E of the fins 108 are removed and recessed to form recessed portions R. In some embodiments, the exposed portions E may be removed by an anisotropic etching process, an isotropic etching process, or a combination thereof. In some embodiments, the exposed portions E of the fins 108 are recessed below the top surfaces 111t of the isolation regions 111. The depth of the recessed portions R is less than the thickness of the isolation regions 111. In other words, the exposed portions E of the fins 108 are not entirely removed, and the remaining fins at opposite sides of the dummy gate structure 112 may be referred to as source/drain regions 120. In some alternative embodiments, the recessing step illustrated in FIG. 1G and FIG. 2G may be omitted.

Figure 1G:
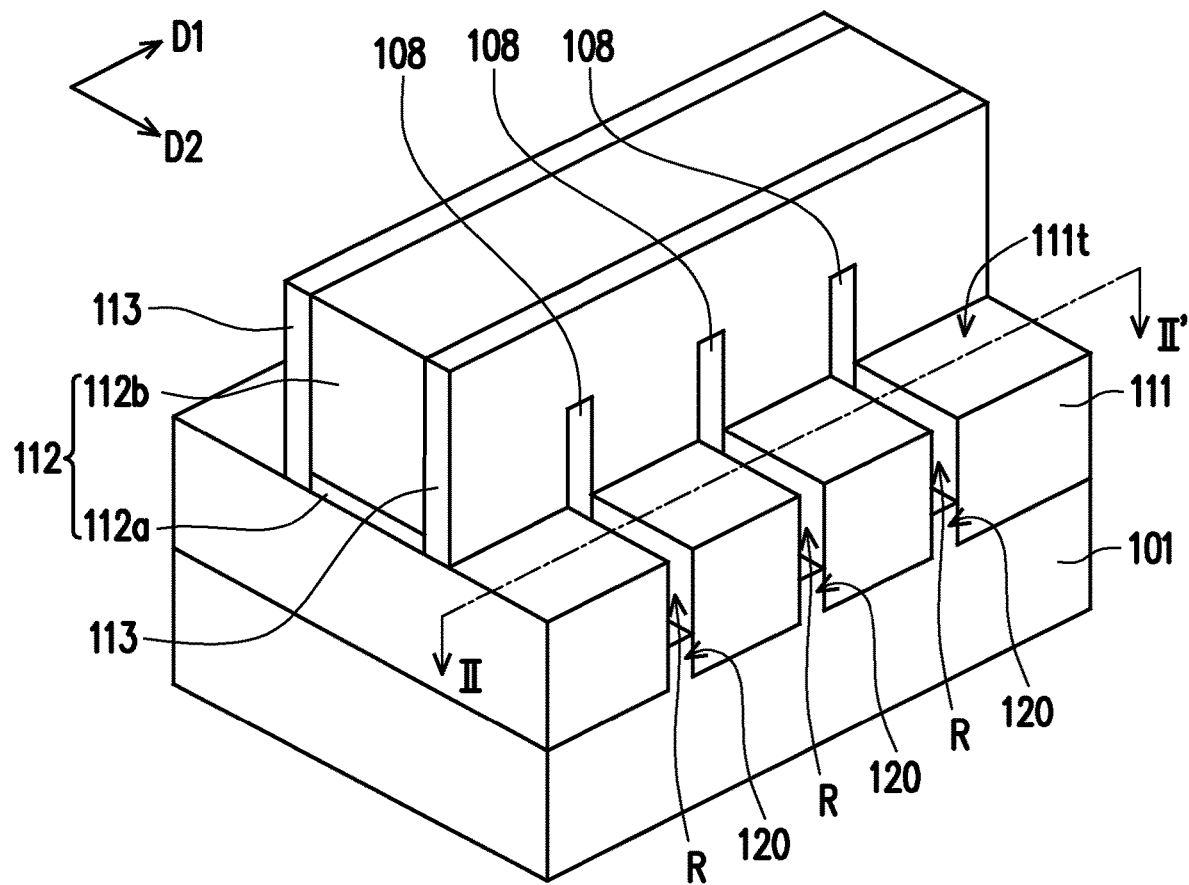
Figure 1H:
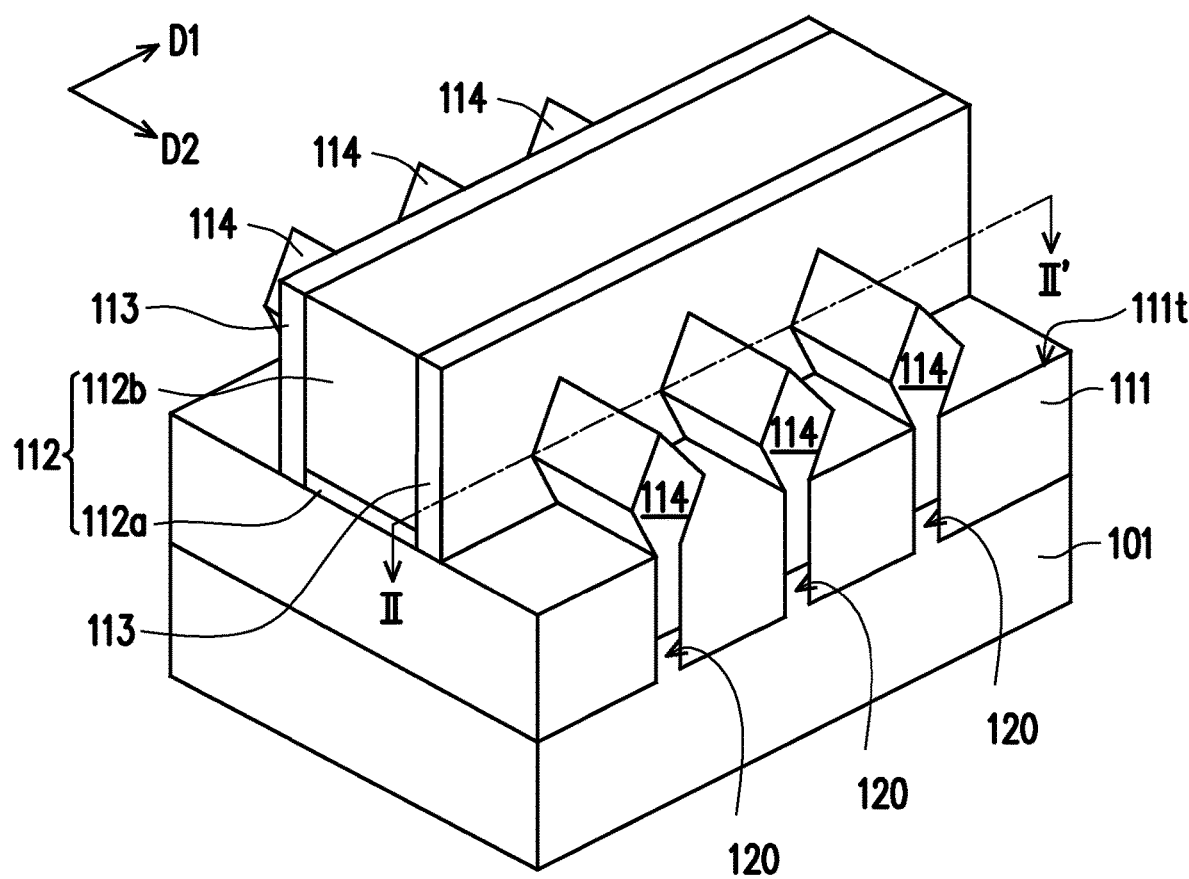
Figure 2H:
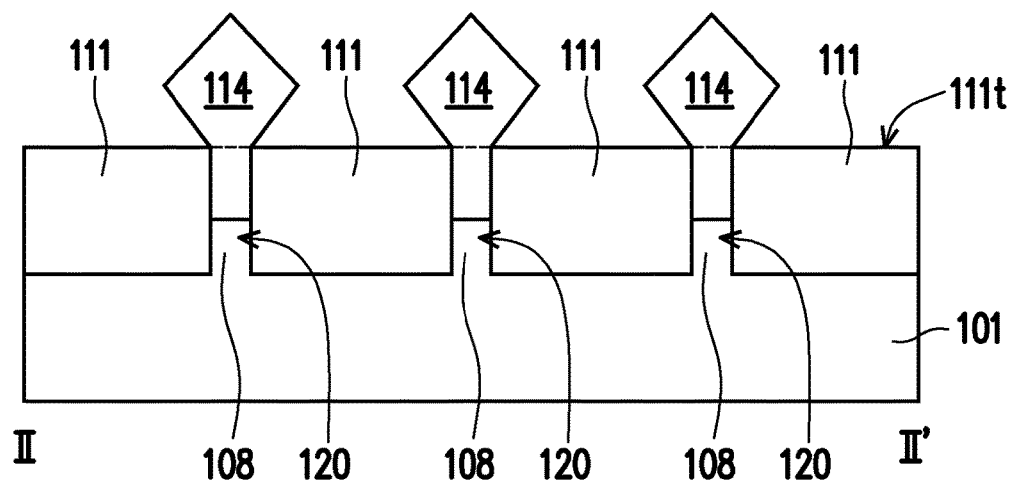

Referring to FIG. 1H and FIG. 2H, a strained material 114 (or a highly doped low resistance material) is grown over the recessed portions R of the semiconductor fin 108 and extends beyond the top surfaces 111t of the isolation regions 111 to strain or stress the fins 108. In other words, the strained material 114 is formed over the source/drain regions 120 of the semiconductor fin 108. In the case, the strained material 114 includes a source disposed at one side of the dummy gate structure 112 and a drain disposed at another side of the dummy gate structure 112. The source covers an end of the fins 108, and the drain covers another end of the fins 108.

In some embodiments, the strained material 114 includes any acceptable material, such as appropriate for p-type FinFETs. For example, if the fins 108 are silicon, the strained material 114 may include SiGe, SiGeB, Ge, GeSn, or the like. In some alternative embodiments, the strained material 114 includes any acceptable material, such as appropriate for n-type FinFETs. For example, if the fins 108 are silicon, the strained material 114 may include silicon, SiC, SiCP, SiP, or the like.

In some embodiments, the strained material 114 may be doped with a conductive dopant. For example, the strained material 114, such as SiGe, may be epitaxial-grown with a p-type dopant for straining a p-type FinFET. That is, the strained material 114 is doped with the p-type dopant to be the source and the drain of the p-type FinFET. The p-type dopant includes boron or $BF_2$, and the strained material 114 may be epitaxial-grown by LPCVD process with in-situ doping. In some alternative embodiments, the strained material 114, such as SiC, SiP, a combination of SiC/SiP, or SiCP is epitaxial-grown with an n-type dopant for straining an n-type FinFET. That is, the strained material 114 is doped with the n-type dopant to be the source and the drain of the n-type FinFET. The n-type dopant includes arsenic and/or phosphorus, and the strained material 114 may be epitaxial-grown by LPCVD process with in-situ doping.

As a result of the epitaxial-grown process used to form the strained material 114, the cross section of the strained material 114 along the line II-II' may have a diamond or pentagonal shape as illustrated. However, the embodiments of the present disclosure are not limited thereto. In other embodiments, the cross section of the strained material 114 also have a hexagonal shape, a pillar shape, or a bar shape. In some embodiments, as shown in FIG. 2H, adjacent strained materials 114 are separated from each other after the epitaxial-grown process is completed. Alternatively, adjacent strained materials 114 may be merged.

Figure 1I:
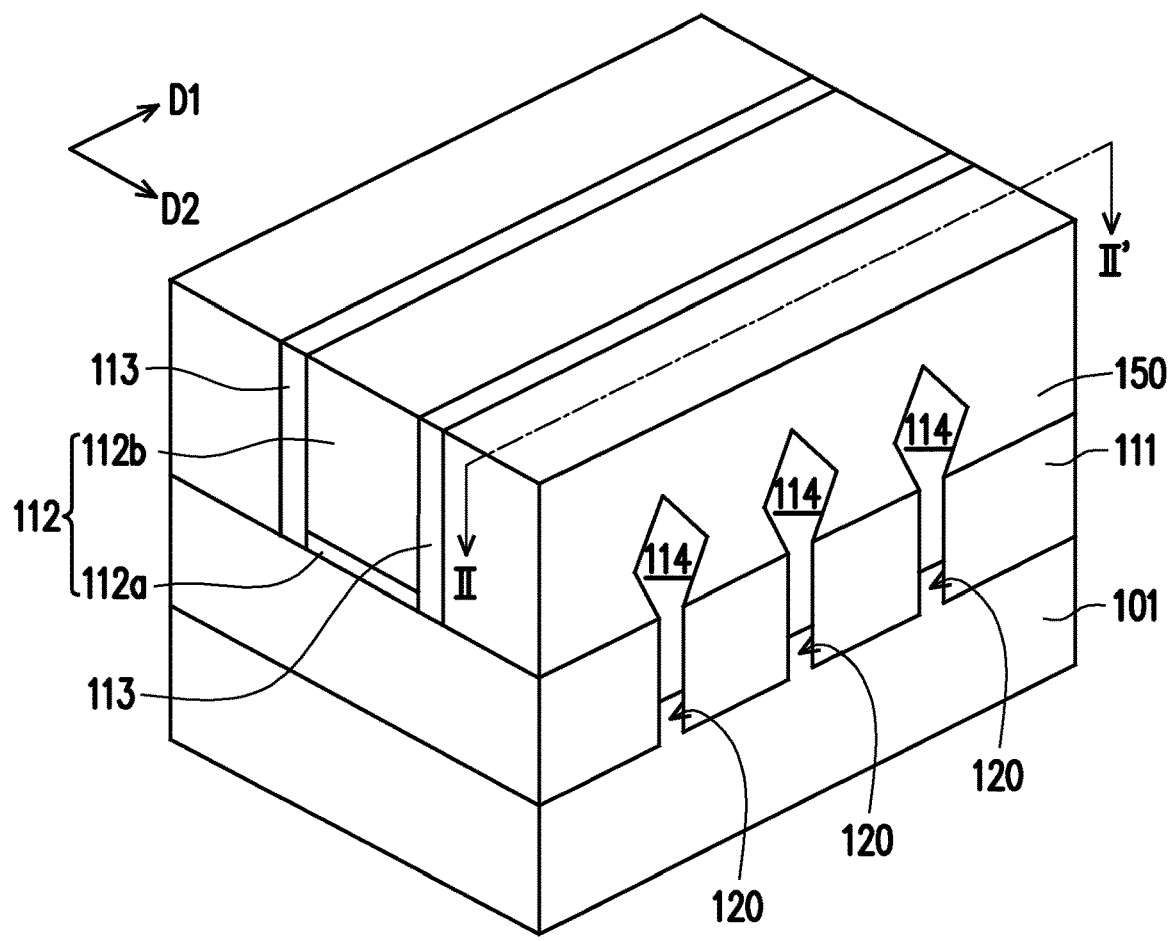
Figure 2I:
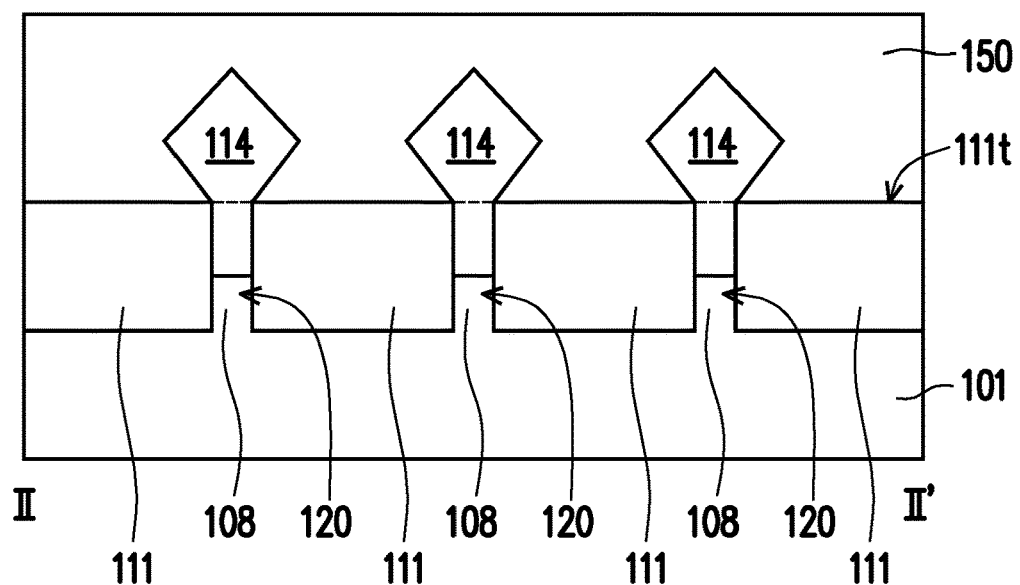

Referring to FIG. 1I and FIG. 2I, an interlayer dielectric (ILD) layer 150 is formed over the strained material 114 and the isolation regions 111. In some embodiments, the ILD layer 150 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 150 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 150 include one or more dielectric materials and/or one or more dielectric layers. In some embodiments, the ILD layer 150 is formed to a suitable thickness by Flowable CVD (FCVD), CVD, HDPCVD, SACVD, spin-on, sputtering, or other suitable methods. For example, an interlayer dielectric material layer (not shown) is initially formed to cover the isolation regions 111, the dummy gate structure 112, and the spacers 113. Subsequently, a thickness of the interlayer dielectric material layer is reduced until the dummy gate structure 112 is exposed, so as to form the ILD layer 150. The process of reducing the thickness of the interlayer dielectric material layer may be achieved by a chemical mechanical polishing (CMP) process, an etching process, or other suitable processes.

Figure 1J:
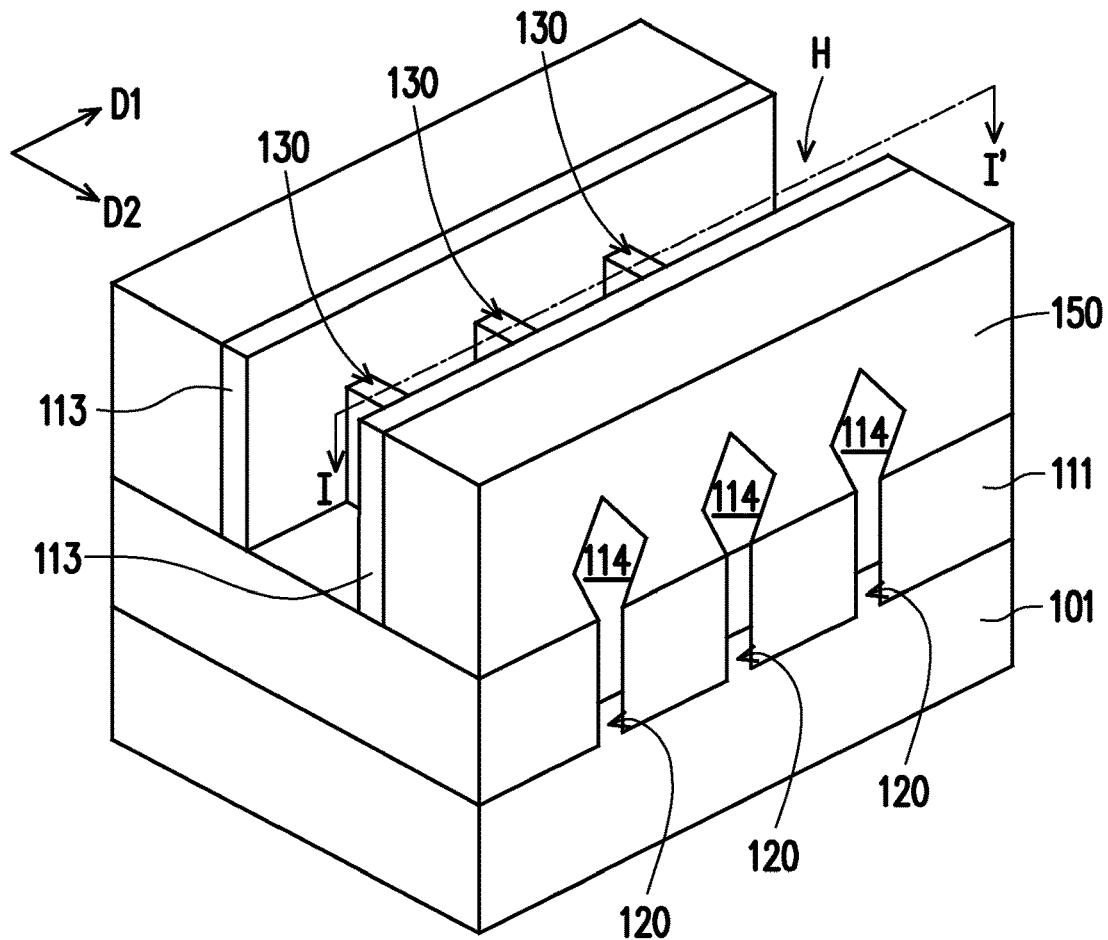
Figure 2J:
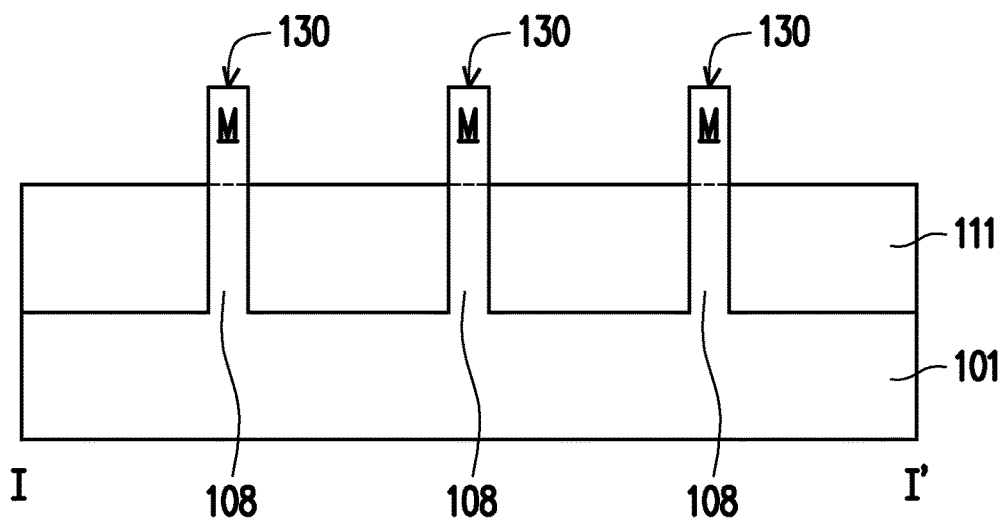

Referring to FIG. 1J and FIG. 2J, the dummy gate structure 112 is removed to form a hollow portion H exposing a portion of the fins 108. For example, the dummy gate 112b and the dummy gate dielectric layer 112a are removed, and the hollow portion H exposes part of the middle portions M of the fins 108. Herein, as shown in FIG. 1J, the fins 108 exposed by the hollow portion H may be referred to as a channel region 130. In some embodiments, the dummy gate 112b and the dummy gate dielectric layer 112a are removed by an etching process or other suitable processes. For example, the dummy gate 112b and the dummy gate dielectric layer 112a may be removed by a wet etching process or a dry etching process. Example of the wet etching process includes chemical etching and example of the dry etching process includes plasma etching. However, the disclosure is not limited thereto. Other commonly known etching method may also be adapted to remove the dummy gate 112b and the dummy gate dielectric layer 112a.

Figure 1K:
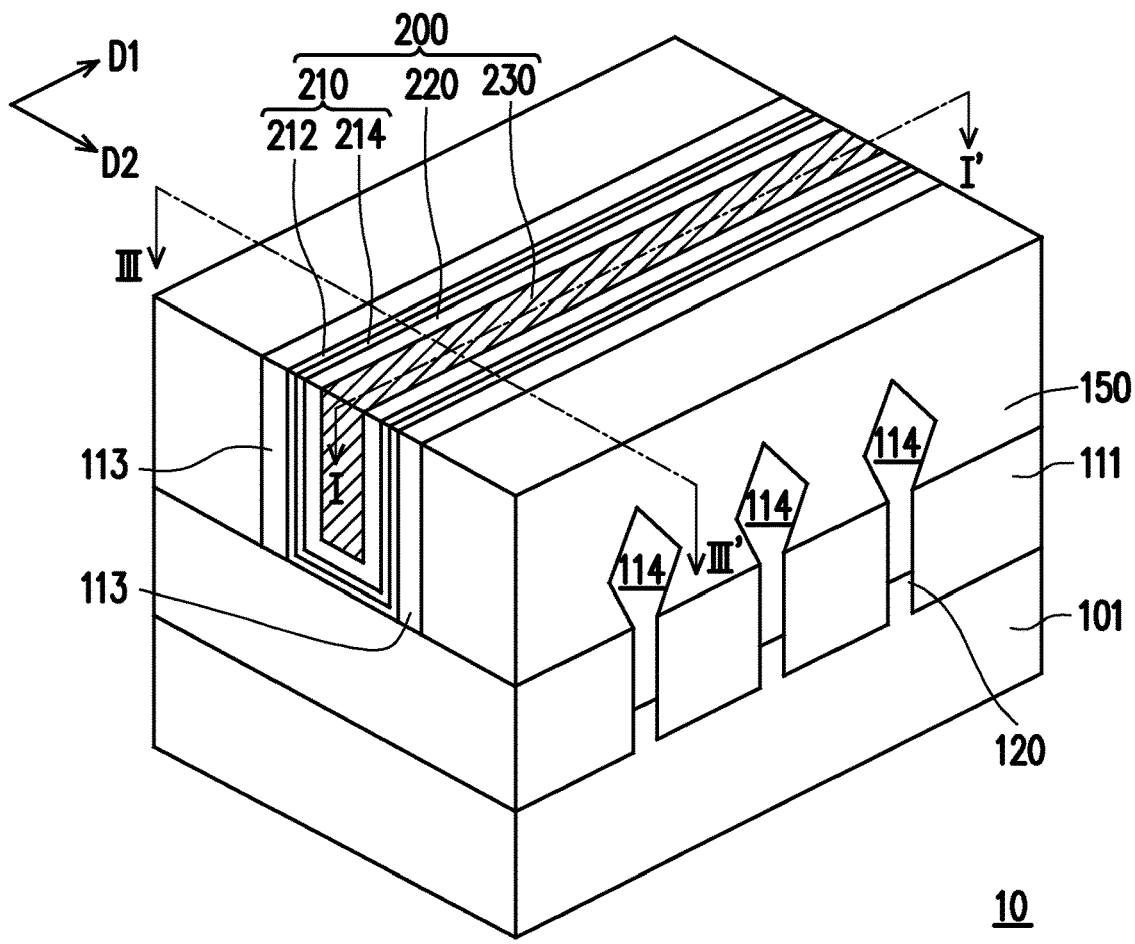
Figure 2K:
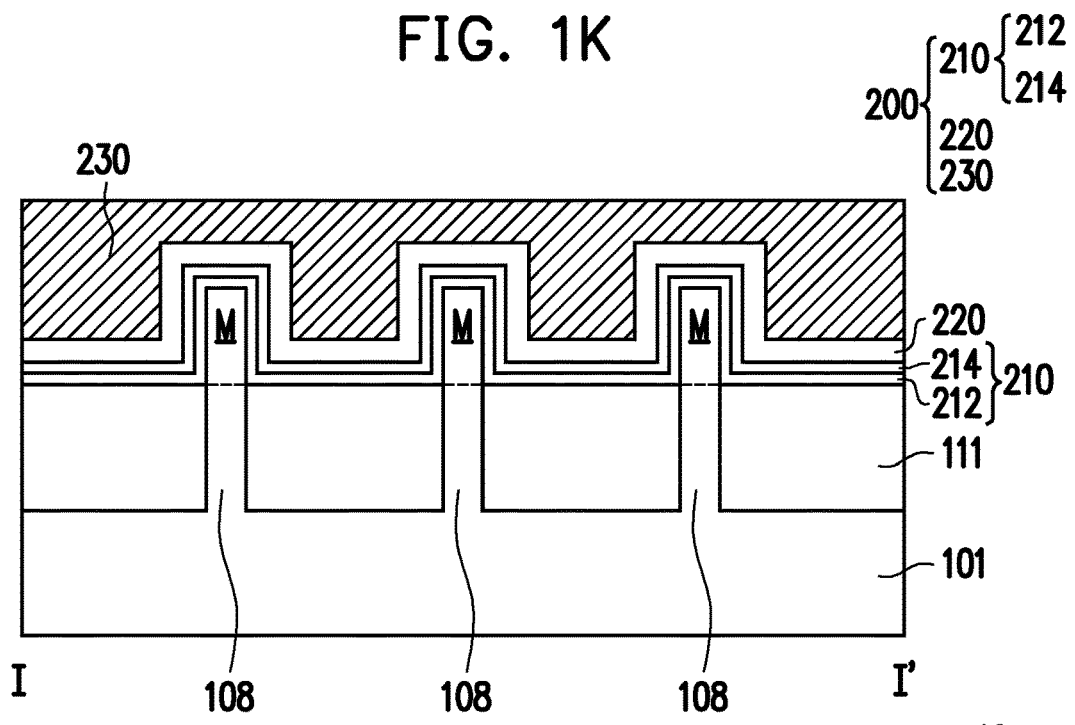

Referring to FIGS. 1J-1K and FIGS. 2J-2K, a gate dielectric layer 210, a cluster layer 220, and a metal layer 130 are sequentially deposited into the hollow portion H to form a gate structure 200, thereby obtaining a FinFET 10. In some embodiments, the gate dielectric layer 210 includes an interface layer 212 and a high-k dielectric layer 214. As illustrated in FIG. 1K and FIG. 2K, the gate structure 200 is disposed across the fins 108 and are sandwiched between the pair of spacers 113. The process for forming the gate structure 200 will be described in detail below.

Figure 3A:
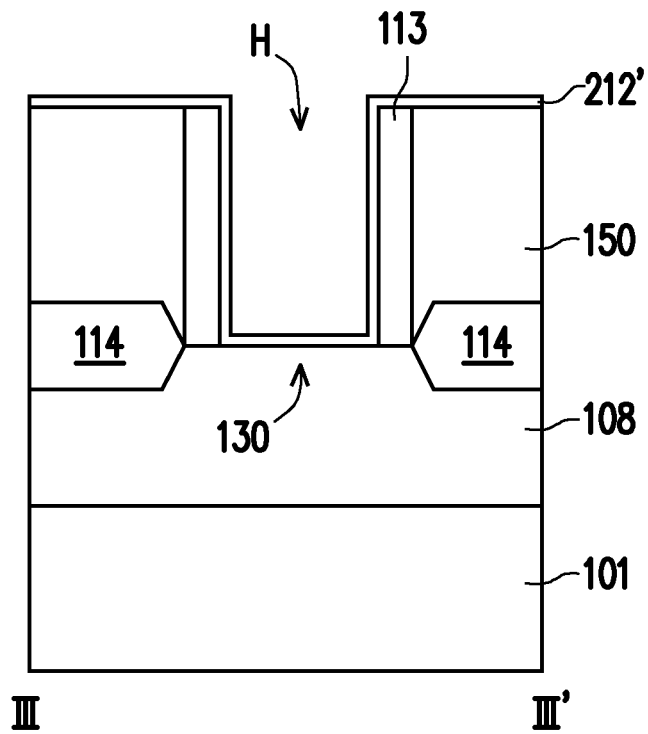
FIG. 3A to FIG. 3E are cross-sectional views illustrating the method for manufacturing a gate structure of the semiconductor device in FIG. 1K.

FIG. 3A to FIG. 3E are cross-sectional views illustrating the method for manufacturing the gate structure 200 of the FinFET 10 taken along the line III-III' of FIG. 1K. Referring to FIG. 3A, an interface material 212' may be conformally formed over the hollow portion H and extends to cover top surfaces of the ILD layer 150 and the spacers 113. In addition, the interface material 212' also conformally covers the channel region 130 shown in FIG. 1J. In some embodiments, the interface material 212' includes a dielectric material, such as silicon oxide layer ($SiO_2$) or silicon oxynitride (SiON). In some embodiments, the interface material 212' is formed by a deposition process, such as atomic layer deposition (ALD), chemical vapor deposition (CVD), and/or other suitable deposition methods. In some alternative embodiments, the interface material 212' is formed by oxidizing the channel region 130 of the fins 108 shown in FIG. 1J through chemical oxidation or thermal oxidation. When the interface material 212' is formed by the oxidation process, the interface material 212' may exhibit different profile from the illustration shown in FIG. 3A. That is, the interface material 212' may be only formed on a top surface of the channel region 130 and not extend to cover the sidewall of the hollow portion H. In some embodiments, the interface material 212' is adapted to provide a good interface between the semiconductor surface (i.e., the fins 108 illustrated in FIG. 2K) and the gate insulator (i.e., the high-k dielectric layer 214 illustrated in FIG. 2K) and to suppress the mobility degradation of the channel carrier of the FinFET 10.

Figure 3B:
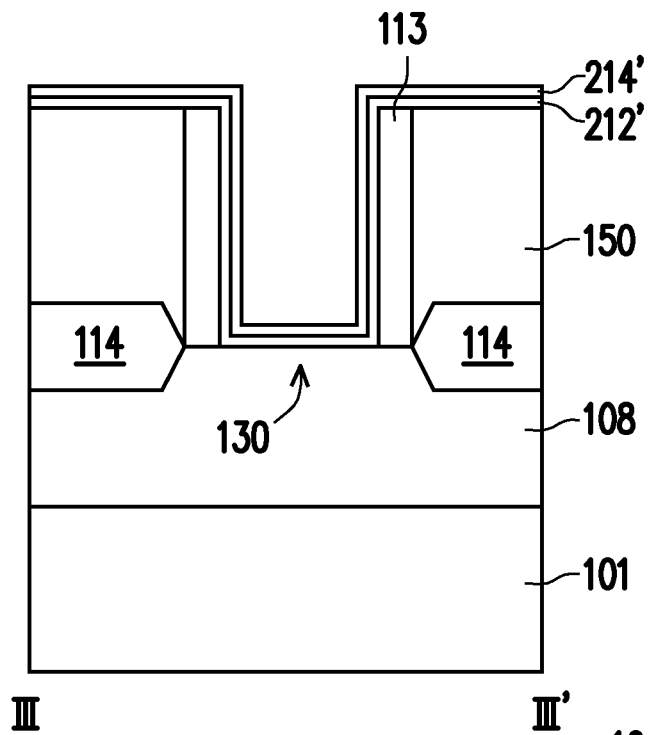

Referring to FIG. 3B, a high-k dielectric material 214' is conformally disposed on the interface material 212' to form a structure 10a. In some embodiments, the high-k dielectric material 214' has a dielectric constant greater than about 4, greater than about 7, greater than about 12, greater than about 16, or even greater than about 20. For example, a material of the high-k dielectric material 214' may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfSiON LaSiO, AlSiO, a combination thereof, or a suitable material. In some alternative embodiments, the high-k dielectric material 214' may optionally include a silicate such as HfSiO, HfSiON LaSiO, AlSiO, a combination thereof, or a suitable material. In some embodiments, the high-k dielectric material 214' is formed by performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

Figure 3C:
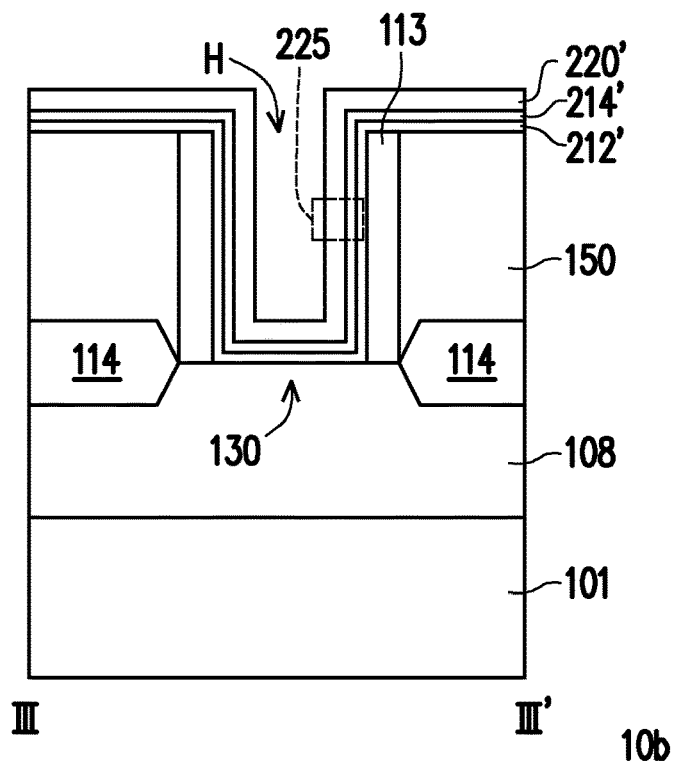

Referring to FIG. 3C, a cluster material 220' is conformally formed on the high-k dielectric material 214'. The process of forming the cluster material 220' will be described in detail below in conjunction with FIG. 4A to FIG. 4D. FIG. 4A to FIG. 4D are schematic enlarged views of a region 225 illustrating the method of forming the cluster material 220' in the gate structure 200 of the FinFET 10 in FIG. 3C.

Figure 4A:
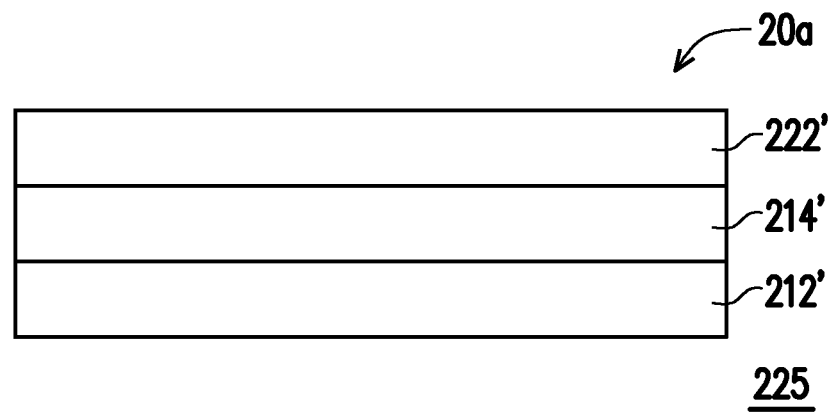
FIG. 4A to FIG. 4D are schematic enlarged views of a region illustrating the method for forming a cluster material of the semiconductor device in FIG. 3C.
Figure 5:
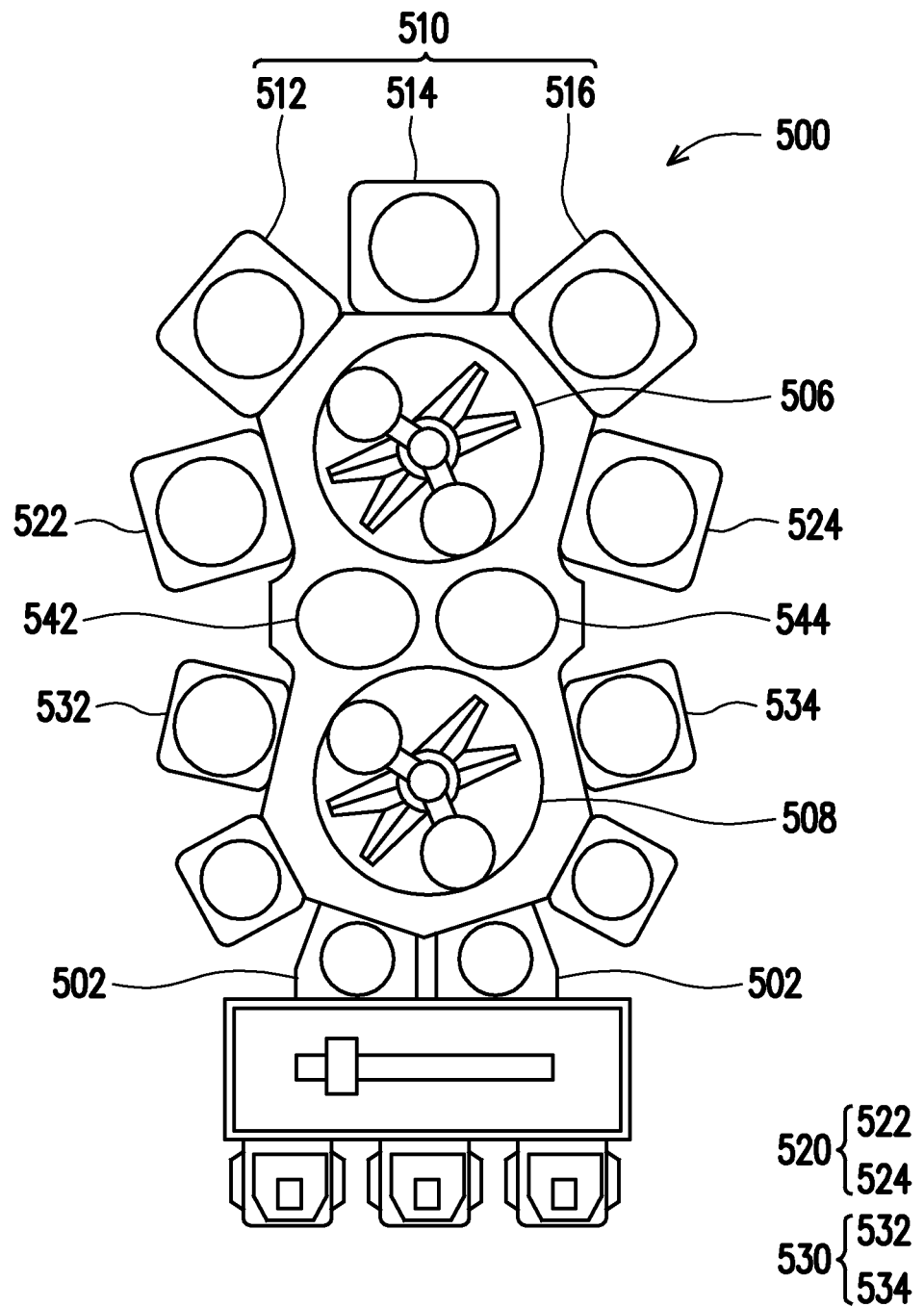
FIG. 5 is a schematic plan view of an atomic layer deposition (ALD) tool for forming the cluster material of the semiconductor device.
Figure 6:
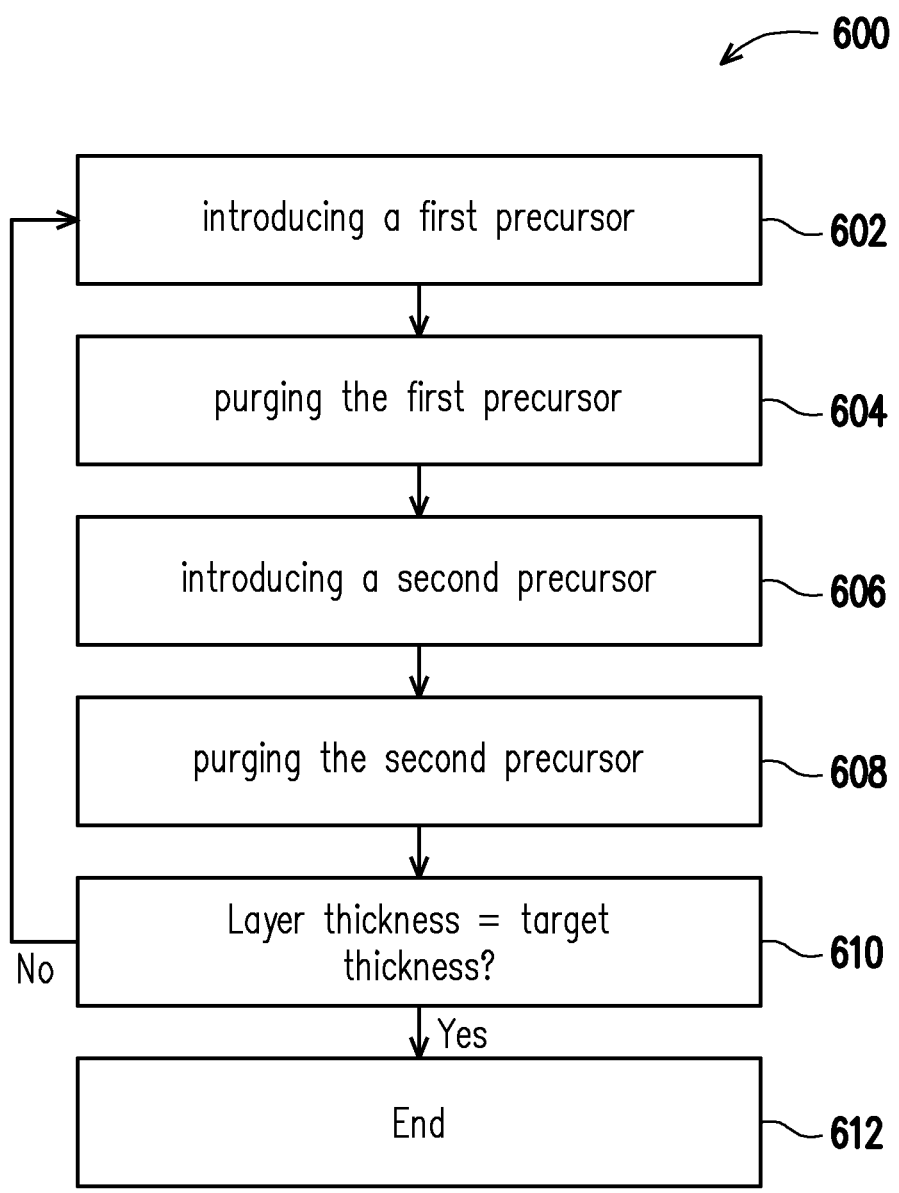
FIG. 6 is a flow chart of an ALD process for forming the work function metal material of the cluster material in FIG. 4A.

Referring to FIG. 4A, a work function metal material 222' is conformally deposited on the high-k dielectric material 214' to form a structure 20a. In some embodiments, the work function metal material 222' includes a N-type work function metal, such as Ti, Al, TiAl, TiAlN, TiAlC, Ta, TaC, TaCN, TaSiN, or a combination thereof. In some alternative embodiments, the work function metal material 222' includes a P-type work function metal, such as TiN, TaN, Ru, Mo, Al, WN, $ZrSi_2$, $MoSi_2$, $TaSi_2$, $NiSi_2$, WN, or a combination thereof. In some embodiments, a method of forming the work function metal material 222' includes performing at least one suitable deposition technique, such as CVD, PECVD, ALD, RPALD, PEALD, MBD, or the like. For example, the work function metal material 222' is a TiAl layer (hereinafter referred to as the TiAl layer 222') and the TiAl layer 222' is formed by ALD. The process of forming the TiAl layer 222' will be described in detail below in conjunction with FIG. 5 and FIG. 6. FIG. 5 is a schematic plan view of an ALD tool 500 for forming the cluster material 220' of the FinFET 10. FIG. 6 is a flow chart of an ALD process 600 for forming the work function metal material (e.g., the TiAl layer 222') in FIG. 4A.

Referring to FIG. 5, the ALD tool 500 is provided to include one or more load lock chambers 502, one or more first processing chambers 512, 514, 516 (collectively referred to as "first chambers 510"), one or more second processing chambers 522, 524 (collectively referred to as "second chambers 520"), one or more third processing chambers 532, 534 (collectively referred to as "third chambers 530"), a first robot 506, a second robot 508, and one or more transfer chambers 542, 544.

Specifically, the load lock chambers 502 may be used for the transfer of substrates into and out from the ALD tool 500. A first robot 506 may transfer the substrates between the load lock chambers 502 and the third chambers 530 (two are shown). Each third chamber 530 is able to be outfitted to perform a number of substrate processing operations, such as cyclical layer deposition including atomic layer deposition (ALD), pre-clean, de-gas, and other substrate processes. The first robot 506 also transfers substrates to or from the transfer chambers 542 and 544.

The transfer chambers 542 and 544 may be used to maintain ultrahigh vacuum conditions while allowing substrates to be transferred within the ALD tool 500. The second robot 508 may transfer the substrates between the transfer chambers 542, 544 and the first and second chambers 510 and 520. Similar to the third chambers 530, the first and second chambers 510 and 520 are able be outfitted to perform a variety of substrate processing operations, such as cyclical layer deposition including atomic layer deposition (ALD), pre-clean, degas, and other substrate processes. In some embodiments, the number of the first, second, and third chambers 510, 520, and 530 may be adjusted by the need of the fabrication, the embodiments of the present disclosure are not limited thereto.

Referring to FIG. 5, the ALD tool 500 may be configured to deposit the cluster material 220' in FIG. 3C. To enhance efficiency and throughput of the system, one configuration includes three first chambers 510 configured to deposit the work function metal material 222', two second chambers 520 configured to deposit the barrier material 224' and the cap material 226', and two third chambers 530 configured to deposit the glue material 228'. In the present embodiment, the first chamber 510 is a TiAl ALD chamber, the second chamber 520 is a TiN and Si-cap ALD chamber, and the third chamber 530 is a TiN ALD chamber. In the case, the work function metal material 222', the barrier material 224', the cap material 226', and the glue material 228' are referred to as in-situ formed. Herein, the term "in-situ" refers to performing a plurality of ALD processes in the same processing system or the single ALD tool 500. In other words, the structure 10a shown in FIG. 3B may be transferred between different chambers 510, 520, 530 in a single process tool 500 and allows to remain under a vacuum condition. Accordingly, the structure 10a is not exposed to an external ambient or an oxygen-containing ambient during forming the work function metal material 222', the barrier material 224', the cap material 226', and the glue material 228'.

Referring to FIG. 5 and FIG. 6, the structure 10a illustrated in FIG. 3B is loaded into the first chamber 510 of the ALD tool 500, where the first chamber 510 is prepared for forming the work function metal material, such as the TiAl layer 222'. For example, the structure 10a is loaded into the first chamber 510, where the structure 10a is heated to a desired temperature. In some embodiments, a temperature maintained in the first chamber 510 is about 250° C. to about 600° C., and a pressure in the first chamber 510 is set to about 0.001 torr to about 100 torr. At block 602, when the structure 10a is loaded into the first chamber 510, a first precursor is introduced into the first chamber 510. In some embodiments, the first precursor includes titanium (Ti). In the case, the structure 10a may be exposed to a titanium-containing precursor. At block 604, the first precursor is purged. Specifically, a purge process is performed to remove any remaining titanium-containing precursor and any by-products from the first chamber 510. At block 606, a second precursor is introduced into the first chamber 510. In some embodiments, the second precursor includes aluminum (Al). In the case, the structure 10a may be exposed to an aluminum-containing precursor. At block 608, the second precursor is purged. Specifically, another purge process is performed to remove any remaining aluminum-containing precursor and any by-products from the first chamber 510. Blocks 602-608 constitute one ALD cycle, which includes two deposition phases (block 602 and block 606) and two purge phases (block 604 and block 608). Each ALD cycle is a self-limiting process, where less than or equal to about one titanium-and-aluminum containing monolayer is deposited during each ALD cycle. The ALD cycle is repeated until the TiAl layer 222' reaches a desired (target) thickness. For example, at block 610, if a thickness of the TiAl layer 222' equals a target thickness (or is within a given threshold of the target thickness), then ALD process 600 ends at block 612. If the thickness of the TiAl layer 222' does not equal the target thickness (or is not within the given threshold of the target thickness), then ALD process 600 returns to block 602 to begin another ALD cycle. In some embodiments, the ALD cycle (blocks 602-608) is repeated until the TiAl layer 222' has a thickness of about 1 Å to about 500 Å. Additional steps can be provided before, during, and after ALD process 600, and some of the steps described can be moved, replaced, or eliminated for additional embodiments of ALD process 600.

In some embodiments, the titanium-containing precursor at block 602 includes titanium tetrachloride ($TiCl_4$), tetrakis (dimethylamino)titanium (TDMAT) (e.g., $Ti[N(CH_3)_2]_4$), tetrakis(diethylamido)titanium (TDEAT), tetrakis(ethylmethylamino)titanium (TEMAT), or other suitable titanium-containing precursor. In some embodiments, a flow rate of the titanium-containing precursor is about 5 sccm to about 5000 sccm. In some embodiments, a carrier gas is used to deliver the titanium-containing precursor to the first chamber 510. In some embodiments, the carrier gas is an inert gas, such as an argon-containing gas, a helium-containing gas, other suitable inert gas, or combinations thereof. In some embodiments, a pulse duration of introducing the titanium-containing precursor is about 0.1 seconds to about 1500 seconds. In some embodiments, a pressure maintained in the first chamber 510 during the titanium-containing pulse duration is about 0.001 torr to about 100 torr. In some embodiments, a temperature maintained in the first chamber 510 during the titanium-containing pulse duration is about 250° C. to about 600° C.

In some embodiments, the purge process at block 604 removes any remaining titanium-containing precursor and various by-products from the first chamber 510. The purge process implements an inert gas, such as an argon-containing gas, a helium-containing gas, other suitable inert gas, or combinations thereof. For example, in the present embodiment, the purge process implements an argon-containing gas, such as Ar. In some embodiments, a flow rate of the inert gas is about 5 sccm to about 5000 sccm. In some embodiments, the purge process duration is about 0.1 seconds to about 1500 seconds. In some embodiments, duration of the purge process and the titanium-containing pulse is about the same amount of time. In some embodiments, a pressure maintained in the first chamber 510 during the purge process is about 0.001 torr to about 1000 torr.

In some embodiments, the aluminum-containing precursor at block 606 includes triethylaluminum (TMA) (e.g., $Al(C_2H_5)_3$), Aviato (e.g., $AlCl_3$), or other suitable aluminum-containing precursor. In some embodiments, a flow rate of the aluminum-containing precursor is about 5 sccm to about 5000 sccm. In some embodiments, a carrier gas is used to deliver the aluminum-containing precursor to the first chamber 510. In some embodiments, the carrier gas is an inert gas, such as an argon-containing gas, a helium-containing gas, other suitable inert gas, or combinations thereof. In some embodiments, a pulse duration of introducing the aluminum-containing precursor is about 0.1 seconds to about 1500 seconds. In some embodiments, a pressure maintained in the first chamber 510 during the aluminum-containing pulse duration is about 0.001 torr to about 1000 torr. In some embodiments, a temperature maintained in the first chamber 510 during the aluminum-containing pulse duration is about 250° C. to about 600° C.

In some embodiments, the purge process at block 608 removes any remaining aluminum-containing precursor and various by-products from the first chamber 510. The purge process implements an inert gas, such as an argon-containing gas, a helium-containing gas, other suitable inert gas, or combinations thereof. For example, in the present embodiment, the purge process implements an argon-containing gas, such as Ar. In some embodiments, a flow rate of the inert gas is about 5 sccm to about 5000 sccm. In some embodiments, the purge process duration is about 0.1 seconds to about 1500 seconds. In some embodiments, duration of the purge process and the aluminum-containing pulse is about the same amount of time. In some embodiments, a pressure maintained in the first chamber 510 during the purge process is about 0.001 torr to about 1000 torr.

Figure 4B:
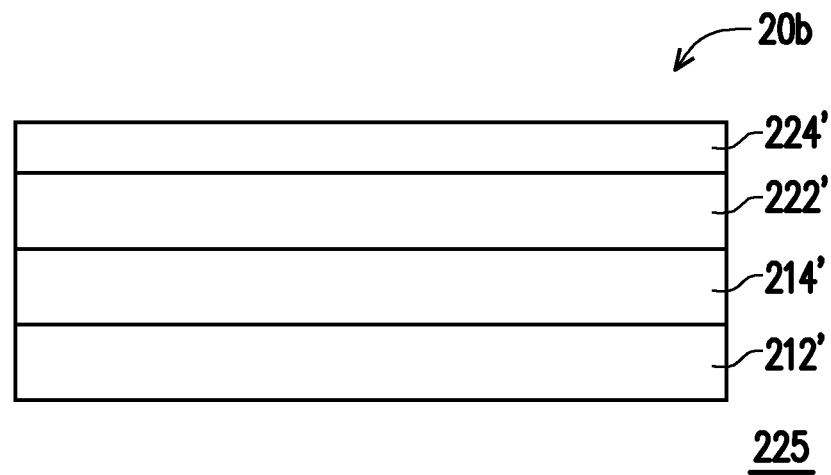
Figure 7:
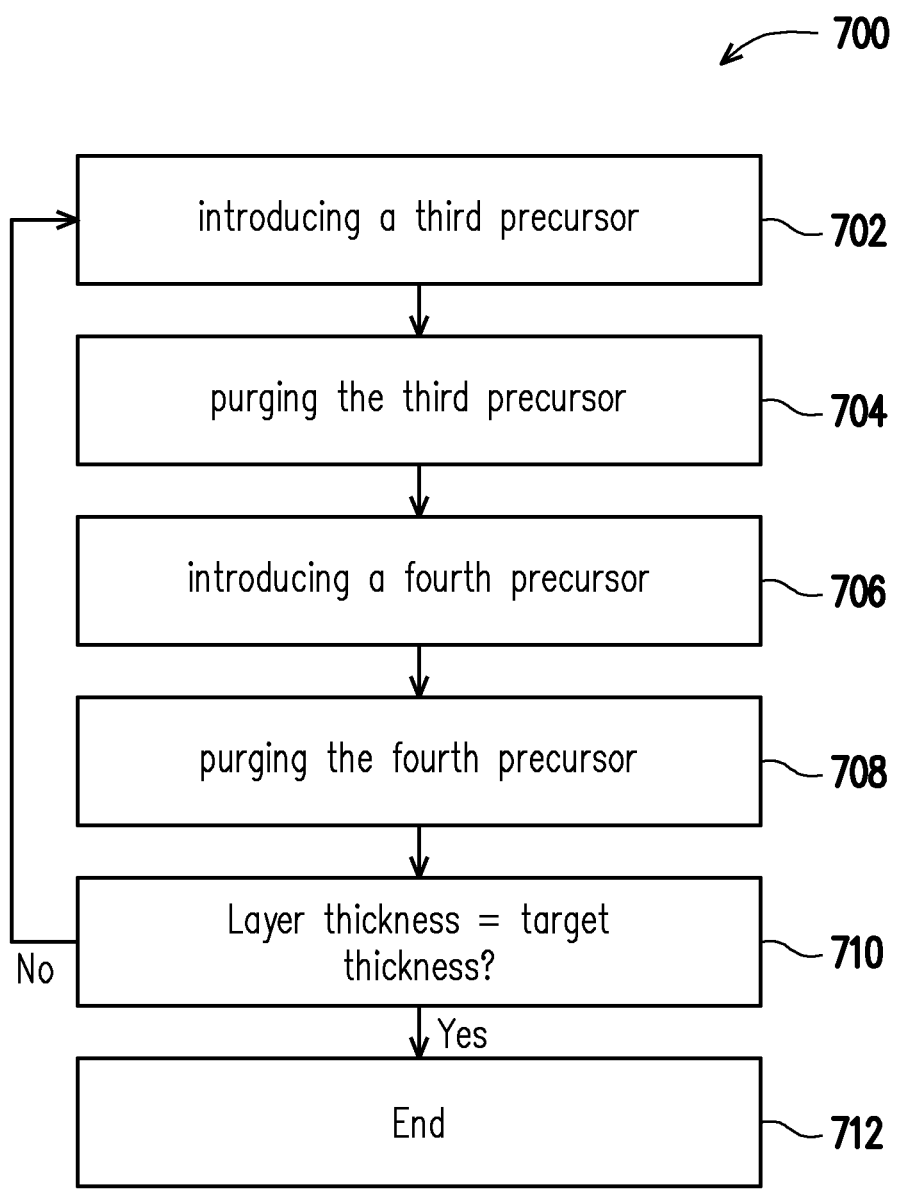
FIG. 7 is a flow chart of an ALD process for forming the barrier material of the cluster material in FIG. 4B.

Referring to FIG. 4B, after forming the work function metal material 222', a barrier material 224' is conformally deposited on the work function metal material 222' to form a structure 20b. In some embodiments, the barrier material 224' includes TiN, Aviato (e.g., $AlCl_3$) or a combination thereof. In some embodiments, a method of forming the barrier material 224' includes performing at least one suitable deposition technique, such as CVD, PECVD, ALD, RPALD, PEALD, MBD, or the like. For example, the barrier material 224' is a TiN layer (hereinafter referred to as a first TiN layer 224') and the first TiN layer 224' is formed by ALD. The process of forming the first TiN layer 224' will be described in detail below in conjunction with FIG. 5 and FIG. 7. FIG. 7 is a flow chart of an ALD process 700 for forming the barrier material (e.g., the first TiN layer 224') in FIG. 4B.

Referring to FIG. 5 and FIG. 7, the structure 20a illustrated in FIG. 4A is transferred from the first chamber 510 into the second chamber 520 of the ALD tool 500. The second chamber 520 is prepared for forming the barrier material, such as the first TiN layer 224'. For example, the structure 20a is loaded into the second chamber 520, where the structure 20a is heated to a desired temperature. In some embodiments, a temperature maintained in the second chamber 520 is about 250° C. to about 600° C., and a pressure in the second chamber 520 is set to about 0.001 torr to about 1000 torr. At block 702, when the structure 20a is loaded into the second chamber 520, a third precursor is introduced into the second chamber 520. In some embodiments, the third precursor includes titanium (Ti). In the case, the structure 20a may be exposed to a titanium-containing precursor. At block 704, the third precursor is purged. Specifically, a purge process is performed to remove any remaining titanium-containing precursor and any by-products from the second chamber 520. At block 706, a fourth precursor is introduced into the second chamber 520. In some embodiments, the fourth precursor includes nitrogen (N). In the case, the structure 20a may be exposed to nitrogen-containing precursor. At block 708, the fourth precursor is purged. Specifically, another purge process is performed to remove any remaining nitrogen-containing precursor and any by-products from the second chamber 520. Blocks 702-708 constitute one ALD cycle, which includes two deposition phases (block 702 and block 706) and two purge phases (block 704 and block 708). Each ALD cycle is a self-limiting process, where less than or equal to about one titanium-and-nitrogen containing monolayer is deposited during each ALD cycle. The ALD cycle is repeated until the first TiN layer 224' reaches a desired (target) thickness. For example, at block 710, if a thickness of the first TiN layer 224' equals a target thickness (or is within a given threshold of the target thickness), then ALD process 700 ends at block 712. If the thickness of the first TiN layer 224' does not equal the target thickness (or is not within the given threshold of the target thickness), then ALD process 700 returns to block 702 to begin another ALD cycle. In some embodiments, the ALD cycle (blocks 702-708) is repeated until the first TiN layer 224' has a thickness of about 0.1 nm to about 50 nm. Additional steps can be provided before, during, and after ALD process 700, and some of the steps described can be moved, replaced, or eliminated for additional embodiments of ALD process 700.

In some embodiments, the titanium-containing precursor at block 702 includes $TiCl_4$, TDMAT, TDEAT, TEMAT or other suitable titanium-containing precursor. In some embodiments, a flow rate of the titanium-containing precursor is about 5 sccm to about 5000 sccm. In some embodiments, a carrier gas is used to deliver the titanium-containing precursor to the second chamber 520. In some embodiments, the carrier gas is an inert gas, such as an argon-containing gas, a helium-containing gas, other suitable inert gas, or combinations thereof. In some embodiments, a pulse duration of introducing the titanium-containing precursor is about 0.1 seconds to about 1500 seconds. In some embodiments, a pressure maintained in the second chamber 520 during the titanium-containing pulse duration is about 0.001 torr to about 1000 torr. In some embodiments, a temperature maintained in the second chamber 520 during the titanium-containing pulse duration is about 250° C. to about 600° C.

In some embodiments, the purge process at block 704 removes any remaining titanium-containing precursor and various by-products from the second chamber 520. The purge process implements an inert gas, such as an argon-containing gas, a helium-containing gas, other suitable inert gas, or combinations thereof. For example, in the present embodiment, the purge process implements an argon-containing gas, such as Ar. In some embodiments, a flow rate of the inert gas is about 5 sccm to about 5000 sccm. In some embodiments, the purge process duration is about 0.1 seconds to about 1500 seconds. In some embodiments, duration of the purge process and the titanium-containing pulse is about the same amount of time. In some embodiments, a pressure maintained in the second chamber 520 during the purge process is about 0.001 torr to about 1000 torr.

In some embodiments, the nitrogen-containing precursor at block 706 includes $NH_3$, NF3 or other suitable nitrogen-containing precursor. In some embodiments, a flow rate of the nitrogen-containing precursor is about 5 sccm to about 5000 sccm. In some embodiments, a carrier gas is used to deliver the nitrogen-containing precursor to the second chamber 520. In some embodiments, the carrier gas is an inert gas, such as an argon-containing gas, a helium-containing gas, other suitable inert gas, or combinations thereof. In some embodiments, a pulse duration of introducing the nitrogen-containing precursor is about 0.1 seconds to about 1000 seconds. In some embodiments, a pressure maintained in the second chamber 520 during the nitrogen-containing pulse duration is about 0.001 torr to about 1000 torr. In some embodiments, a temperature maintained in the second chamber 520 during the nitrogen-containing pulse duration is about 250° C. to about 600° C. In some alternative embodiments, the structure 20a is exposed to a nitrogen-containing plasma to nitride the surface of the structure 20a after performing the blocks 702-704. For example, the nitrogen-containing plasma is generated from a nitrogen-containing gas, such as $N_2$.

In some embodiments, the purge process at block 708 removes any remaining nitrogen-containing precursor and various by-products from the second chamber 520. The purge process implements an inert gas, such as an argon-containing gas, a helium-containing gas, other suitable inert gas, or combinations thereof. For example, in the present embodiment, the purge process implements an argon-containing gas, such as Ar. In some embodiments, a flow rate of the inert gas is about 5 sccm to about 5000 sccm. In some embodiments, the purge process duration is about 0.1 seconds to about 1500 seconds. In some embodiments, duration of the purge process and the nitrogen-containing pulse is about the same amount of time. In some embodiments, a pressure maintained in the second chamber 520 during the purge process is about 0.001 torr to about 1000 torr.

In one embodiment, if the ALD processes 600 and 700 are performed "ex-situ", which the exposed surface of the structure 20a may be exposed to an external ambient or to an oxygen-containing ambient when the structure 20a is transferred between processing systems and/or processing chambers. For example, the TiAl layer 222' may be undesirably oxidized when exposed to oxygen ambient, which may change the work function of the TiAl layer 222', thereby affecting the threshold voltage of NMOS transistor. In addition, the undesired titanium oxide, aluminum oxide, or titanium-aluminum oxide also increases the resistance of the gate structure. To minimize such occurrences, in the present embodiment, the ALD processes 600 and 700 are performed "in-situ", which refers to performing the ALD processes 600 and 700 on the structure 10a (as shown in FIG. 3B) in different chambers 510, 520 within the same processing system or processing tool 500, allowing the structure 10a to remain under vacuum conditions during the ALD processes 600 and 700. That is, the ALD processes 600 and 700 are performed on the structure 10a without exposing the structure 10a to an external ambient or to an oxygen-containing ambient.

Figure 4C:
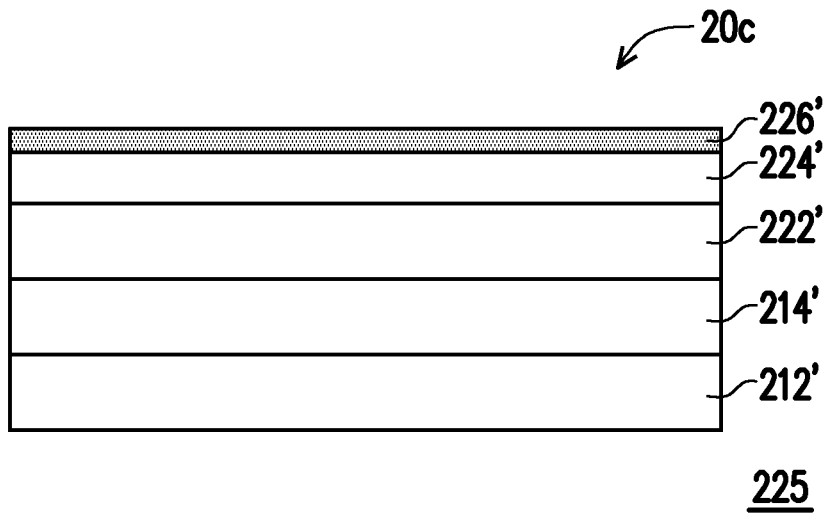
Figure 8:
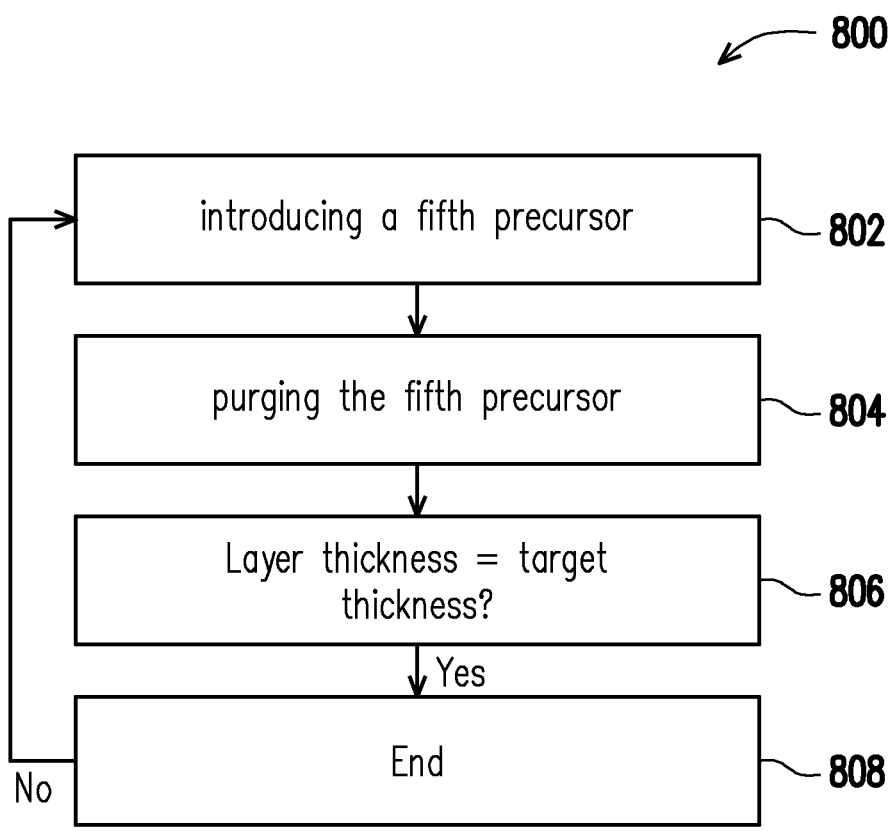
FIG. 8 is a flow chart of an ALD process for forming the cap material of the cluster material in FIG. 4C.

Referring to FIG. 4C, after forming the barrier material 224', a cap material 226' is conformally deposited on the barrier material 224' to form a structure 20c. In some embodiments, the cap material 226' includes an amorphous material with a group IVA element, such as Si, C, Ge, or a combination thereof. In some embodiments, a method of forming the cap material 226' includes performing at least one suitable deposition technique, such as CVD, PECVD, ALD, RPALD, PEALD, MBD, or the like. For example, when the cap material 226' is formed by ALD, the cap material 226' (hereinafter referred to as a Si layer 226') is an amorphous silicon material, rather than crystalline silicon material. Unlike the crystalline silicon material has a well-ordered crystal lattice, the said amorphous silicon material may have silicon atoms arranged disorderly to form a continuous random network. In some embodiments, the amorphous silicon material may have some dangling bonds for forming to-be-formed glue material 228' by ALD. The process of forming the Si layer 226' will be described in detail below in conjunction with FIG. 5 and FIG. 8. FIG. 8 is a flow chart of an ALD process for forming the cap material (e.g., the Si layer 226') of the cluster material 220' in FIG. 4C.

Referring to FIG. 5 and FIG. 8, the structure 20b illustrated in FIG. 4B is still in the second chamber 520 to subsequently form the cap material, such as the Si layer 226'. That is, the Si layer 226' and the first TiN layer 224' are formed in the same chamber 520. In some embodiments, a temperature maintained in the second chamber 520 is about 250° C. to about 600° C., and a pressure in the second chamber 520 is set to about 0.001 torr to about 1000 torr. At block 802, after forming the first TiN layer 224' in the second chamber 520, a fifth precursor is introduced into the second chamber 520. In some embodiments, the fifth precursor includes a silane gas which is selected from the group consisting of dichlorosilane (DCS), tetrachlorosilane (TCS), hexachlorodisilane (HCD) and monosilane. In some embodiments, a flow rate of the silane gas is about 0.001 sccm to about 1000 sccm. In some embodiments, a pulse duration of introducing the silane gas is about 0.1 seconds to about 1500 seconds. In some embodiments, a pressure maintained in the second chamber 520 during the silane gas pulse duration is about 0.001 torr to about 1000 torr. In some embodiments, a temperature maintained in the second chamber 520 during the silane gas duration is about 250° C. to about 600° C.

At block 804, the fifth precursor is purged. Specifically, a purge process is performed to remove any remaining silane gas and any by-products from the second chamber 520. The purge process implements an inert gas, such as an argon-containing gas, a helium-containing gas, other suitable inert gas, or combinations thereof. In some embodiments, a flow rate of the inert gas is about 5 sccm to about 5000 sccm. In some embodiments, the purge process duration is about 0.1 seconds to about 1500 seconds. In some embodiments, duration of the purge process and the silane gas pulse is about the same amount of time. In some embodiments, a pressure maintained in the second chamber 520 during the purge process is about 0.001 torr to about 1000 torr. Blocks 802-804 constitute one ALD cycle, which includes one deposition phase (block 802) and one purge phase (block 804). Each ALD cycle is a self-limiting process, where less than or equal to about one silicon monolayer is deposited during each ALD cycle. The ALD cycle is repeated until the Si layer 226' reaches a desired (target) thickness. For example, at block 806, if a thickness of the Si layer 226' equals a target thickness (or is within a given threshold of the target thickness), then ALD process 800 ends at block 808. If the thickness of the Si layer 226' does not equal the target thickness (or is not within the given threshold of the target thickness), then ALD process 800 returns to block 802 to begin another ALD cycle. In some embodiments, the ALD cycle (blocks 802-804) is repeated until the Si layer 226' has a thickness of about 0.1 nm to about 10 nm, alternatively a thickness of about 5 Å to about 500 Å. Additional steps can be provided before, during, and after ALD process 800, and some of the steps described can be moved, replaced, or eliminated for additional embodiments of ALD process 800. For example, after block 804, the Si—H bonds are formed on the surface of the silicon monolayer, which limits silicon growth. Accordingly, a $H_2$ desorption (e.g., electron stimulated desorption (ESD)) is required to create dangling bonds, thereby adsorbing additional silane precursors resulting in silicon growth to the target thickness. In some embodiments, the Si layer 226' grown by the ALD process 800 is a pure Si layer. That is, the primary element of the Si layer 226' is silicon. Alternatively, some impurities may be included in the Si layer 226'.

It should be noted that the ALD processes 700 and 800 are performed "in-situ", which refers to performing the ALD processes 700 and 800 on the structure 20a (as shown in FIG. 4A) in the same chamber 520 within the same processing tool 500, allowing the structure 20a to remain under vacuum conditions during the ALD processes 700 and 800. That is, the ALD processes 700 and 800 are performed on the structure 20a without exposing the structure 20a to an external ambient or to an oxygen-containing ambient.

As noted above, the ALD processes 700 and 800 are performed in-situ, without removing the structure 20a from the second chamber 520 between said deposition steps. By depositing both the first TiN layer 224' and the Si layer 226' in the same reaction chamber 520, it is possible to avoid the formation of an undesired interface between the first TiN layer 224' and the Si layer 226'. In some embodiments, a plurality of silicon-nitrogen (Si—N) bonds are formed between the first TiN layer 224' and the Si layer 226'. Depositing two layers in one reaction chamber may reduce fabrication costs. Also, the elimination of the intermediate structure transfer step may simplify the processing logistics and increases throughput. In some alternative embodiments, when the cap material 226' is an amorphous carbon material, a plurality of carbon-nitrogen (C—N) bonds are formed between the first TiN layer 224' and the cap material 226'. In some alternative embodiments, when the cap material 226' is an amorphous germanium material, a plurality of germanium-nitrogen (Ge—N) bonds are formed between the first TiN layer 224' and the cap material 226'.

Figure 4D:
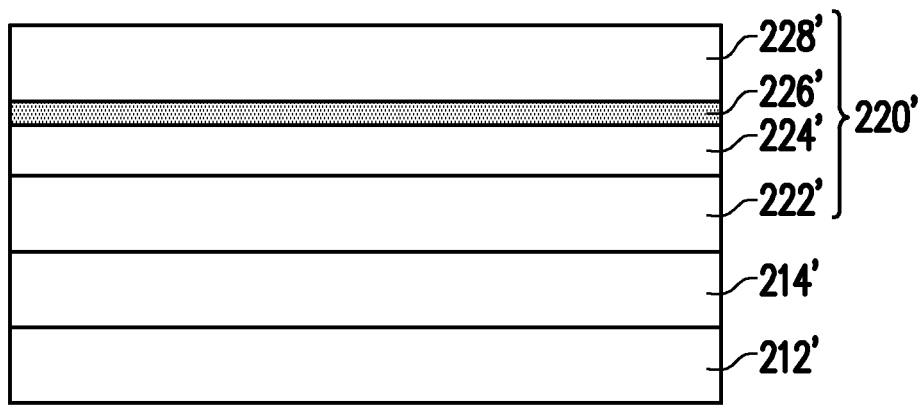
Figure 9:
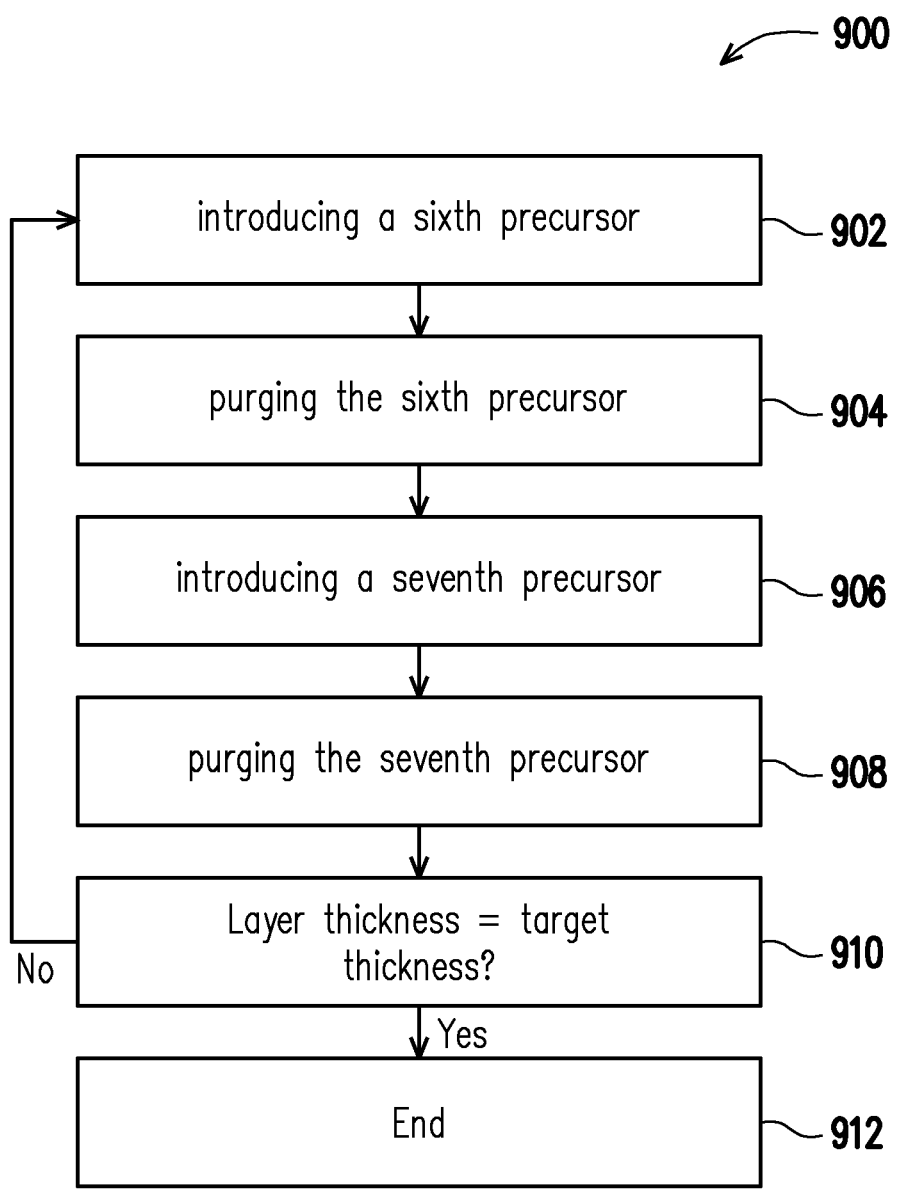
FIG. 9 is a flow chart of an ALD process for forming the glue material of the cluster material in FIG. 4D.

Referring to FIG. 4D, after forming the cap material 226', a glue material 228' is conformally deposited on the cap material 226' to obtain the cluster material 220'. In some embodiments, the glue material 228' includes TiN, Aviato (e.g., $AlCl_3$), or a combination thereof. In some embodiments, a method of forming the glue material 228' includes performing at least one suitable deposition technique, such as CVD, PECVD, ALD, RPALD, PEALD, MBD, or the like. For example, the glue material 228' is a TiN layer (hereinafter referred to as a second TiN layer 228') and the second TiN layer 228' is formed by ALD. The process of forming the second TiN layer 228' will be described in detail below in conjunction with FIG. 5 and FIG. 9. FIG. 9 is a flow chart of an ALD process for forming the glue material (e.g., the second TiN layer 228') of the cluster material 220' in FIG. 4D.

Referring to FIG. 5 and FIG. 9, the structure 20c illustrated in FIG. 4C is transferred from the second chamber 520 into the third chamber 530 of the ALD tool 500. The third chamber 530 is prepared for forming the glue material, such as the second TiN layer 228'. For example, the structure 20c is loaded into the third chamber 530, where the structure 20c is heated to a desired temperature. In some embodiments, a temperature maintained in the third chamber 530 is about 250° C. to about 600° C., and a pressure in the third chamber 530 is set to about 0.001 torr to about 1000 torr. At block 902, when the structure 20c is loaded into the third chamber 530, a sixth precursor is introduced into the third chamber 530. In some embodiments, the sixth precursor includes titanium (Ti). In the case, the structure 20c may be exposed to a titanium-containing precursor. At block 904, the sixth precursor is purged. Specifically, a purge process is performed to remove any remaining titanium-containing precursor and any by-products from the third chamber 530. At block 906, a seventh precursor is introduced into the third chamber 530. In some embodiments, the seventh precursor includes N. In the case, the structure 20c may be exposed to nitrogen-containing precursor. At block 908, the seventh precursor is purged. Specifically, another purge process is performed to remove any remaining nitrogen-containing precursor and any by-products from the third chamber 530. Blocks 902-908 constitute one ALD cycle, which includes two deposition phases (block 902 and block 906) and two purge phases (block 904 and block 908). Each ALD cycle is a self-limiting process, where less than or equal to about one titanium-and-nitrogen containing monolayer is deposited during each ALD cycle. The ALD cycle is repeated until the second TiN layer 228' reaches a desired (target) thickness. For example, at block 910, if a thickness of the second TiN layer 228' equals a target thickness (or is within a given threshold of the target thickness), then ALD process 900 ends at block 912. If the thickness of the second TiN layer 228' does not equal the target thickness (or is not within the given threshold of the target thickness), then ALD process 900 returns to block 902 to begin another ALD cycle. In some embodiments, the ALD cycle (blocks 902-908) is repeated until the second TiN layer 228' has a thickness of about 5 Å to about 500 Å. Additional steps can be provided before, during, and after ALD process 900, and some of the steps described can be moved, replaced, or eliminated for additional embodiments of ALD process 900.

In some embodiments, the titanium-containing precursor at block 902 includes $TiCl_4$, TDMAT, TDEAT, TEMAT, or other suitable titanium-containing precursor. The flow rate of the titanium-containing precursor, the carrier gas, the pulse duration, the pressure, and the temperature at block 902 are similar to those at block 702 and has been described in detail in the above embodiments. Thus, details thereof are omitted here. In some alternative embodiments, the deposition parameters at block 902 and at block 702 are different from each other.

In some embodiments, the purge process at block 904 removes any remaining titanium-containing precursor and various by-products from the third chamber 530. The purge inert gas, the flow rate of the inert gas, the purge process duration, and the pressure at block 904 are similar to those at block 704 and has been described in detail in the above embodiments. Thus, details thereof are omitted here. In some alternative embodiments, the purge parameters at block 904 and at block 704 are different from each other.

In some embodiments, the nitrogen-containing precursor at block 906 includes ammonia ($NH_3$), $NF_3$, or other suitable nitrogen-containing precursor. The flow rate of the nitrogen-containing precursor, the carrier gas, the pulse duration, the pressure, and the temperature at block 906 are similar to those at block 706 and has been described in detail in the above embodiments. Thus, details thereof are omitted here. In some alternative embodiments, the deposition parameters at block 906 and at block 706 are different from each other. In some alternative embodiments, the structure 20c is exposed to a nitrogen-containing plasma to nitride the surface of the structure 20c after performing the blocks 902-904. For example, the nitrogen-containing plasma is generated from a nitrogen-containing gas, such as $N_2$.

In some embodiments, the purge process at block 908 removes any remaining nitrogen-containing precursor and various by-products from the third chamber 530. The purge inert gas, the flow rate of the inert gas, the purge process duration, and the pressure at block 908 are similar to those at block 708 and has been described in detail in the above embodiments. Thus, details thereof are omitted here. In some alternative embodiments, the purge parameters at block 908 and at block 708 are different from each other.

In one embodiment, if the ALD processes 800 and 900 are performed "ex-situ", which the exposed surface of the structure 20c may be exposed to an external ambient or to an oxygen-containing ambient when the structure 20c is transferred between processing systems and/or processing chambers. In the case, the Si layer 226' may be undesirably oxidized when exposed to oxygen ambient, which may change the physical and chemical properties of the Si layer 226'. In detail, the Si layer may be oxidized as a silicon oxide (SiO) layer, which increases the thickness of the cap material and the resistance of the gate structure. The SiO layer may continuously cover the exposed surface of the structure 20c, which result in the glue material not easily stand on the SiO layer and need thicker glue material to cover the SiO layer, thereby preventing the peeling issue between the glue material and the subsequently formed metal material. However, the thicker glue material may face the challenge of filling in the hollow portion H shown in FIG. 3C. Further, the formation of the SiO layer requires more queue time (Q-time) for oxidation, which leads to increase process time and decrease throughput. To minimize such occurrences, in the present embodiment, the ALD processes 800 and 900 are performed "in-situ", which refers to performing the ALD processes 800 and 900 on the structure 20b (as shown in FIG. 4B) in different chambers 520, 530 within the same processing system or processing tool 500, allowing the structure 20b to remain under vacuum conditions during the ALD processes 800 and 900. That is, the ALD processes 800 and 900 are performed on the structure 20b without exposing the structure 20b to an external ambient or to an oxygen-containing ambient.

As noted above, by depositing both the Si layer 226' and the second TiN layer 228' in the same ALD tool 500, it is possible to avoid the formation of an undesired interface or undesired oxide between the Si layer 226' and the second TiN layer 228'. In addition, since all materials 222', 224', 226', 228' of the cluster material 220' are formed in-situ, no undesired interface or undesired oxide is formed between any adjacent two of the materials 222', 224', 226', 228'. That is, all materials 222', 224', 226', 228' may be referred to as a single layer without any interface therebetween. In some embodiments, a plurality of silicon-nitrogen (Si—N) bonds are formed between the Si layer 226' and the second TiN layer 228'. In some alternative embodiments, when the cap material 226' is an amorphous carbon material, a plurality of carbon-nitrogen (C—N) bonds are formed between the first TiN layer 224' and the second TiN layer 228'. In some other embodiments, when the cap material 226' is an amorphous germanium material, a plurality of germanium-nitrogen (Ge—N) bonds are formed between the first TiN layer 224' and the second TiN layer 228'. In the case, no native oxide is formed between the Si layer 226' and the second TiN layer 228', thereby decreasing the resistance of the gate structure 200 of the FinFET 10 and improving the conductivity of the gate structure 200 of the FinFET 10 by about 20%. Therefore, the glue material (i.e., the second TiN layer 228') may easily stand on the Si layer 226' and use thinner glue material (e.g., 10 Å to 50 Å) to prevent the peeling issue between the glue material and the subsequently formed metal material 230'. Since the Si layer 226' and the second TiN layer 228' are formed in-situ, no Q-time is needed for oxidation, thereby simplifying process steps, saving process time, and increasing throughput. Further, the thinner glue material benefits to fill in the hollow portion H shown in FIG. 3C, especially the narrower width of the gate structure in advanced technology node. Herein, the term "technology node" may refer to the geometry of the process, such as critical dimension.

It should be noted that, in some embodiments, the Si layer 226' is able to attract and/or prevent Al and/or Ti atoms of the work function metal material 222' (i.e., the TiAl layer 222') from diffusing into the interface material 212' and/or into the seam (i.e., the hollow portion H illustrated in FIG. 3B), thereby avoiding threshold voltage (Vt) shift of the device and improving the control ability of the gate structure. In addition, the Si layer 226' may further prevent Al and/or Ti atoms of the work function metal material 222' from diffusing into the fins 108, thereby decreasing leakage current, increasing the breakdown voltage (Vbd) of the device, and avoiding the gate dielectric layer 210 (as shown in FIG. 1K) burning out.

Referring back to FIG. 3C and FIG. 3D, after depositing the cluster material 220', a metal material 230' is formed over the cluster material 220' to fill up the remaining hollow portion H. In some embodiments, the metal material 230' includes W, Cu, AlCu, or a combination thereof. The metal material 230' may be formed by using a suitable process, such as ALD, CVD, PVD, plating, or combinations thereof. When the metal material 230' is a tungsten metal material, a precursor for forming the tungsten metal material 230' may include tungsten hexafluoride ($WF_6$) and hydrogen ($H_2$). In some embodiments, the formation of the metal material 230' is conducted under a temperature of 250° C. to 600° C.

It should be noted that the metal material 230' is ex-situ formed. Herein, the term "ex-situ" refers to performing different deposition processes in different processing systems or tools. In other words, the structure 10b shown in FIG. 3C may be transferred between different process tools. Accordingly, the cluster material 220' is exposed to an external ambient or an oxygen-containing ambient during forming the metal material 230'. In the case, an additional TiON layer (not shown) may be formed between the metal material 230' and the glue material 228'. Since the cluster material 220' is exposed to the external ambient or the oxygen-containing ambient, the external oxygen would diffuse into the cluster material 220'. In some embodiments, the Si layer 226' may block the external oxygen from diffusing into the work function metal material 222', thereby avoiding threshold voltage (Vt) shift of the device and improving the control ability of the gate structure. In some alternative embodiments, the Si layer 226' may react with a small amount of the external oxygen to form few silicon oxide (SiO) segments in the Si layer 226'. In the case, a ratio of a silicon content to an oxygen content in the Si layer 226' is at least greater than 3, in alternative embodiments. That is, only few of the oxygen atoms are distributed in the Si layer 226'. Further, since the cluster material 220' is formed in-situ, the oxygen content of the whole cluster material 220' is lower than the ex-situ formed structure.

On the other hands, the Si layer 226' also blocks the internal oxygen of the interface material 212' from diffusing into the metal material 230', thereby avoiding the gate dielectric layer 210 (as shown in FIG. 1K) burning out. Accordingly, an oxygen content of the glue material 228' (e.g., the second TiN layer) may be less than or equal to a nitrogen content thereof.

Figure 3D:
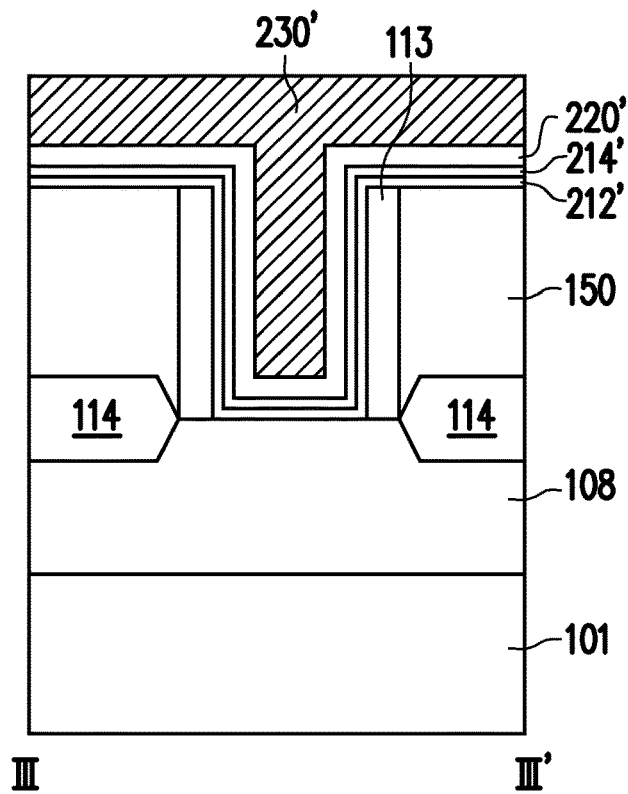
Figure 3E:
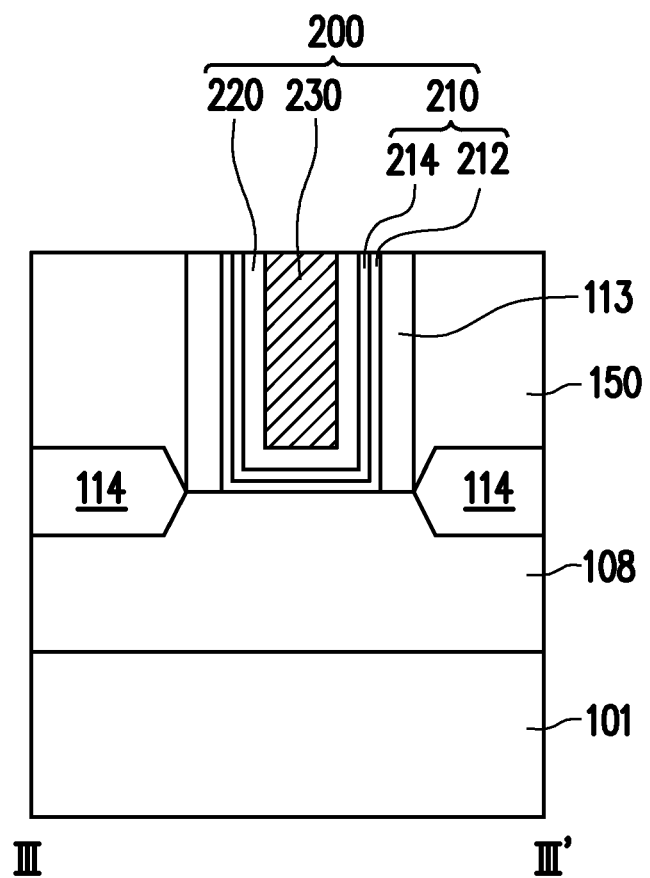

Referring to FIG. 3D and FIG. 3E, excess layers outside the hollow portion H are removed to form the gate structure 200. In some embodiments, portions of the interface material 212', portions of the high-k dielectric material 214', portions of the cluster material 220', and portions of the metal material 230' outside the hollow portion H are removed by a planarization process, so as to form the interface layer 212, the high-k layer 214, the cluster layer 220, and the metal layer 230. The cluster layer 220 may sequentially include a work function metal layer formed from the work function metal material 222', a barrier layer formed from the barrier material 224', a cap layer formed from the cap material 226', and a glue layer formed from the glue material 228'. In some embodiments, the planarization process may include performing a CMP process. In some embodiments, the metal layer 230 may be utilized as a gate electrode. As illustrated in FIG. 3E, the interface layer 212, the high-k layer 214, and the cluster layer 220 have U-shape cross-sections. The high-k dielectric layer 214 is sandwiched between the interface layer 212 and the cluster layer 220, and the cluster layer 220 is sandwiched between the high-k dielectric layer 214 and the metal layer 230.

As mentioned above, the precursor gas for forming the metal layer 230 includes $WF_6$. In some embodiments, the fluorine atom in $WF_6$ may be introduced into the metal layer 230 as impurities. During the formation process of the metal material 230' or in the subsequent thermal processes, the fluorine atom may diffuse into the work function metal material 222' (as shown in FIG. 4D), thereby leading threshold voltage (Vt) shift in the device. As a result, the performance of the device is compromised. Nevertheless, as mentioned above, since the cap material 226' with amorphous silicon, amorphous carbon, or amorphous germanium is sandwiched between the work function metal material 222' and the metal layer 230, the cap material 226' may block the fluorine in the metal layer 230 from diffusing into the work function metal layer 222', thereby avoiding threshold voltage (Vt) shift. As such, the performance of the FinFET 10 may be ensured. Moreover, since the silicon atoms or the aluminum atoms within the cap material 226' are able to trap the fluorine impurities, the cluster layer 220 may be a thin layer while maintaining sufficient blocking function. In the case, the thin cluster layer 220 benefits to fill in the hollow portion H shown in FIG. 3C, thereby increasing the gap filling window of forming metal gate.

The processes illustrate in FIGS. 1J-1K and FIGS. 2J-2K are commonly referred to as a metal replacement process. In some embodiments, the dummy gate structure 112 including polysilicon is replaced by the gate structure 200 which includes metal. Since the dummy gate structure 112 are being replaced by the gate structure 200, subsequent process of forming metallic interconnection (not shown) can be implemented. For instance, other conductive lines (not shown) are formed to electrically connect the metal layer 230 with other elements in the FinFET 10.

Figure 10:
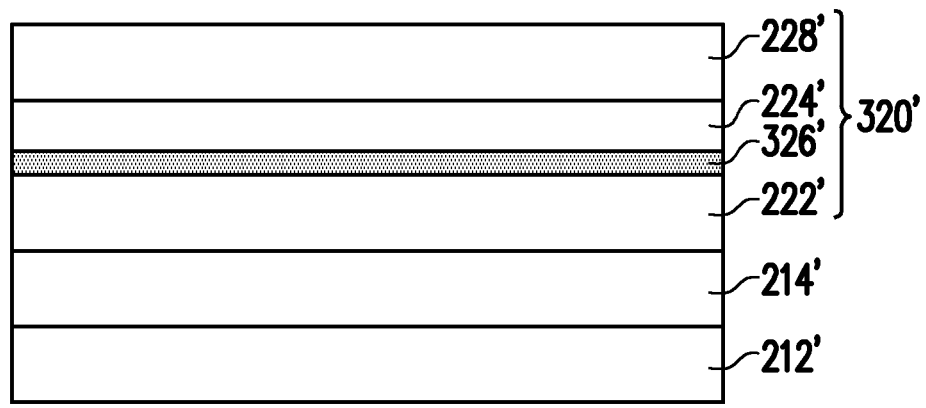
FIG. 10 is a schematic enlarged view of a cluster material of a gate structure in accordance with alternative embodiments of the disclosure.

FIG. 10 is a schematic enlarged view of a cluster material of a gate structure in accordance with alternative embodiments of the disclosure.

Referring to FIG. 10, a cluster material 320' is similar to the cluster material 220' of FIG. 4D, that is, the structures, materials, and functions of the cluster material 320' are similar to those of the cluster material 220', and thus the details are omitted herein. The main difference between the cluster material 320' and the cluster material 220' lies in that the position of the cap material. Specifically, the cluster material 320' has one cap material 326' sandwiched between the work function metal material 222' and the barrier material 224'. In some embodiments, the cap material 326' has the same material with the cap material 226'. In the case, the cap material 326' is able to attract and/or prevent Al and/or Ti atoms of the work function metal material 222' (i.e., the TiAl layer 222') from diffusing into the interface material 212' and/or into the seam (i.e., the hollow portion H illustrated in FIG. 3B), thereby avoiding threshold voltage (Vt) shift of the device and improving the control ability of the gate structure.

Figure 11:
FIG. 11 is a schematic enlarged view of a cluster material of a gate structure in accordance with other embodiments of the disclosure.

FIG. 11 is a schematic enlarged view of a cluster material of a gate structure in accordance with other embodiments of the disclosure.

Referring to FIG. 11, a cluster material 420' is similar to the cluster material 220' of FIG. 4D, that is, the structures, materials, and functions of the cluster material 420' are similar to those of the cluster material 220', and thus the details are omitted herein. The main difference between the cluster material 420' and the cluster material 220' lies in that the cluster material 420' has two cap material 226, 326', where one cap material 226' is sandwiched between the barrier material 224' and the glue material 228' and another cap material 326' is sandwiched between the work function metal material 222' and the barrier material 224'. In some embodiments, the cap material 226' and the cap material 326' have the same material or different materials. In the case, both of the cap materials 226' and 326' are able to attract and/or prevent Al and/or Ti atoms of the work function metal material 222' (i.e., the TiAl layer 222') from diffusing into the interface material 212' and/or into the seam (i.e., the hollow portion H illustrated in FIG. 3B), thereby avoiding threshold voltage (Vt) shift of the device and improving the control ability of the gate structure.

According to some embodiments, a gate structure includes a gate dielectric layer, a metal layer, and a cluster layer. The metal layer is disposed over the gate dielectric layer. The cluster layer is sandwiched between the metal layer and the gate dielectric layer, wherein the cluster layer at least includes an amorphous silicon layer, an amorphous carbon layer, or an amorphous germanium layer.

According to some embodiments, a method of forming a gate structure includes forming a gate dielectric layer on a substrate; sequentially and in-situ forming a work function metal layer, a barrier layer, a cap layer, and a glue layer through an atomic layer deposition (ALD) process, wherein the cap layer comprises an amorphous layer with a group IVA element; and forming a metal layer on the glue layer.

According to some embodiments, a semiconductor device includes a substrate, a gate structure, and source/drain (S/D) regions. The substrate includes at least one fin thereon. The gate structure covers a portion of the at least one fin, wherein the gate structure includes a gate dielectric layer contacting the at least one fin, a metal layer, and a cluster layer sandwiched between the metal layer and the gate dielectric layer. The cluster layer includes a work function metal layer disposed on the gate dielectric layer; a barrier layer disposed on the work function layer; a glue layer disposed over the barrier layer; and a first cap layer sandwiched between the barrier layer and the glue layer. The first cap layer includes a group IVA element and a plurality of silicon-nitrogen (Si—N) bonds, a plurality of carbon-nitrogen (C—N) bonds, or a plurality of germanium-nitrogen (Ge—N) bonds are included between the first cap layer and the glue layer. The source/drain (S/D) regions are disposed on opposite sides of the at least one fin with respect to the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure, comprising:
   forming a gate dielectric layer on a substrate;
   sequentially and in-situ forming a work function metal layer, a barrier layer, a cap layer, and a glue layer through an atomic layer deposition (ALD) process, wherein the cap layer comprises an amorphous layer with a group IVA element; and
   forming a metal layer on the glue layer, wherein the forming the metal layer is an ex-situ process, and a TiON layer is formed between the metal layer and the glue layer.

2. The method of claim 1, wherein the forming the work function metal layer comprises:
   introducing a first precursor to a first chamber, wherein the first precursor comprises Ti;
   purging the first precursor in the first chamber;
   introducing a second precursor to the first chamber, wherein the second precursor comprises Al; and
   purging the second precursor in the first chamber to form the work function metal layer, wherein the work function metal layer at least comprises TiAl.

3. The method of claim 2, wherein the forming the barrier layer comprises:
   introducing a third precursor to a second chamber, wherein the third precursor comprises $TiCl_4$;
   purging the third precursor in the second chamber;
   introducing a fourth precursor to the second chamber, wherein the fourth precursor comprises $NH_3$; and
   purging the fourth precursor in the second chamber to form the barrier layer, wherein the barrier layer comprises TiN.

4. The method of claim 3, further comprising forming the cap layer by introducing a fifth precursor to the second chamber after forming the barrier layer, wherein the fifth precursor comprises a silane gas which is selected from the group consisting of dichlorosilane (DCS), tetrachlorosilane (TCS), hexachlorodisilane (HCD) and monosilane, and the cap layer comprises the amorphous silicon layer.

5. The method of claim 4, wherein the barrier layer and the cap layer are formed in a same chamber.

6. The method of claim 4, wherein the forming the glue layer comprises:
   introducing a sixth precursor to a third chamber, wherein the sixth precursor comprises $TiCl_4$;

purging the sixth precursor in the third chamber;
introducing a seventh precursor to the third chamber, wherein the seventh precursor comprises NH$_3$; and
purging the seventh precursor in the third chamber to form the glue layer,
wherein the glue layer comprises TiN.

7. The method of claim 1, wherein the substrate is transferred between different chambers in a single process tool and allowed to remain under a vacuum condition during the in-situ forming the work function metal layer, the barrier layer, the cap layer, and the glue layer.

8. The method of claim 1, wherein the substrate is not exposed to an external ambient or an oxygen-containing ambient during the in-situ forming the work function metal layer, the barrier layer, the cap layer, and the glue layer.

9. A method of forming a gate structure, comprising:
forming a gate dielectric layer on a substrate;
forming a cluster layer on the gate dielectric layer through an atomic layer deposition (ALD) process, wherein the cluster layer at least comprises a work function metal layer, a first cap layer, a barrier layer, and a glue layer, wherein the work function metal layer is in direct contact with the gate dielectric layer, the first cap layer is in direct contact with the work function metal layer, and the first cap layer comprises a first amorphous layer with a group IVA element; and
forming a metal layer on the glue layer.

10. The method of claim 9, wherein the cluster layer further comprises a second cap layer formed between the barrier layer and the glue layer, and the second cap layer comprises a second amorphous layer with a group IVA element.

11. The method of claim 10, wherein the first cap layer and the second cap layer have different materials.

12. The method of claim 9, wherein the forming the work function metal layer comprises:
introducing a first precursor to a first chamber, wherein the first precursor comprises Ti;
purging the first precursor in the first chamber;
introducing a second precursor to the first chamber, wherein the second precursor comprises Al; and
purging the second precursor in the first chamber to form the work function metal layer, wherein the work function metal layer at least comprises TiAl.

13. The method of claim 12, wherein the forming the barrier layer comprises:
introducing a third precursor to a second chamber, wherein the third precursor comprises TiCl$_4$;
purging the third precursor in the second chamber;
introducing a fourth precursor to the second chamber, wherein the fourth precursor comprises NH$_3$; and
purging the fourth precursor in the second chamber to form the barrier layer, wherein the barrier layer comprises TiN.

14. The method of claim 13, further comprising forming the first cap layer by introducing a fifth precursor to the second chamber after forming the barrier layer, wherein the fifth precursor comprises a silane gas which is selected from the group consisting of dichlorosilane (DCS), tetrachlorosilane (TCS), hexachlorodisilane (HCD) and monosilane, and the cap layer comprises the amorphous silicon layer.

15. The method of claim 14, wherein the forming the glue layer comprises:
introducing a sixth precursor to a third chamber, wherein the sixth precursor comprises TiCl$_4$;
purging the sixth precursor in the third chamber;
introducing a seventh precursor to the third chamber, wherein the seventh precursor comprises NH$_3$; and
purging the seventh precursor in the third chamber to form the glue layer, wherein the glue layer comprises TiN.

16. The method of claim 9, wherein the forming the metal layer is an ex-situ process, and a TiON layer is formed between the metal layer and the glue layer.

17. A method of forming a semiconductor device, comprising:
providing a substrate comprising at least one fin thereon;
forming a gate structure covering a portion of the at least one fin, wherein the gate structure comprises a gate dielectric layer contacting the at least one fin, a metal layer, and a cluster layer sandwiched between the metal layer and the gate dielectric layer, wherein the cluster layer at least comprises:
a work function metal layer formed on the gate dielectric layer;
a barrier layer formed on the work function layer;
a glue layer formed over the barrier layer; and
a first cap layer formed between the barrier layer and the glue layer, wherein the first cap layer comprises an amorphous carbon layer and a plurality of carbon-nitrogen (C—N) bonds are formed between the first cap layer and the glue layer; and
forming source/drain (S/D) regions disposed on opposite sides of the at least one fin with respect to the gate structure.

18. The method of claim 17, wherein the forming the metal layer is an ex-situ process, and a TiON layer is formed between the metal layer and the glue layer.

19. The method of claim 17, wherein the cluster layer further comprises a second cap layer formed between the work function metal layer and the barrier layer, and the second cap layer comprises a second amorphous layer with a group IVA element.

20. The method of claim 17, wherein the substrate is not exposed to an external ambient or an oxygen-containing ambient during the forming the cluster layer on the gate dielectric layer.

* * * * *